(12) United States Patent
Yazawa et al.

(10) Patent No.: US 9,871,983 B2
(45) Date of Patent: *Jan. 16, 2018

(54) SOLID-STATE IMAGING APPARATUS

(71) Applicant: PANASONIC INTELLECTUAL PROPERTY MANAGEMENT CO., LTD., Osaka (JP)

(72) Inventors: Keisuke Yazawa, Osaka (JP); Motonori Ishii, Osaka (JP); Yutaka Hirose, Kyoto (JP); Yoshihisa Kato, Shiga (JP); Yoshiyuki Matsunaga, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/377,613

(22) Filed: Dec. 13, 2016

(65) Prior Publication Data

US 2017/0094206 A1    Mar. 30, 2017

Related U.S. Application Data

(60) Division of application No. 14/723,498, filed on May 28, 2015, now Pat. No. 9,554,067, which is a
(Continued)

(30) Foreign Application Priority Data

Dec. 5, 2012 (JP) .................................. 2012-265932

(51) Int. Cl.
*H04N 5/363* (2011.01)
*H04N 5/374* (2011.01)
(Continued)

(52) U.S. Cl.
CPC ........... *H04N 5/363* (2013.01); *H01L 27/307* (2013.01); *H04N 5/374* (2013.01); *H04N 5/378* (2013.01);
(Continued)

(58) Field of Classification Search
CPC ........ H04N 5/335; H04N 5/357; H04N 5/363; H04N 5/369; H04N 5/3741; H04N 5/3745; H04N 5/378; H01L 27/307
See application file for complete search history.

(56) References Cited

U.S. PATENT DOCUMENTS 4,363,963 A    12/1982    Ando
6,493,030 B1   12/2002    Kozlowski et al.
(Continued)

FOREIGN PATENT DOCUMENTS

JP    55-120182 A     9/1980
JP    2002-510944 A   4/2002
(Continued)

OTHER PUBLICATIONS

International Search Report of PCT Applicaiton No. PCT/JP2013/004382, dated Oct. 22, 2011.

*Primary Examiner* — Daniel M Pasiewicz
(74) *Attorney, Agent, or Firm* — McDermott Will & Emery LLP

(57) ABSTRACT

A solid-state imaging apparatus includes a pixel including: a photoelectric converter that generates a signal charge corresponding to incident light; a charge storage section that is connected to the photoelectric converter and accumulates signal charge; a reset transistor; an amplifying transistor; and a cutoff transistor, wherein the amplifying transistor and the cutoff transistor form a negative feedback amplifying circuit.

9 Claims, 15 Drawing Sheets

Related U.S. Application Data continuation of application No. PCT/JP2013/004382, filed on Jul. 18, 2013.

(51) Int. Cl.
*H04N 5/3745* (2011.01)
*H04N 5/378* (2011.01)
*H01L 27/30* (2006.01)

(52) U.S. Cl.
CPC ......... *H04N 5/3741* (2013.01); *H04N 5/3745* (2013.01)

(56) References Cited

U.S. PATENT DOCUMENTS

| | | |
|---|---|---|
| 8,922,687 B2 | 12/2014 | Yarino et al. |
| 9,344,654 B2 | 5/2016 | Ishii |
| 9,554,067 B2 * | 1/2017 | Yazawa ................. H04N 5/363 |
| 2006/0001752 A1 | 1/2006 | Yanagisawa et al. |
| 2013/0107095 A1 | 5/2013 | Marino et al. |

FOREIGN PATENT DOCUMENTS

| | | |
|---|---|---|
| JP | 2006-019927 A | 1/2006 |
| JP | 2012-019168 A | 1/2012 |

* cited by examiner

SOLID-STATE IMAGING APPARATUS

RELATED APPLICATIONS

This application is the divisional application of U.S. patent application Ser. No. 14/723,498, filed on May 28, 2015, which is the continuation of International Patent Application No. PCT/JP2013/004382, filed on Jul. 18, 2013, which in turn claims the benefit of Japanese Patent Application No. 2012-265932, filed on Dec. 5, 2012, the disclosures of which Applications are incorporated by reference herein.

TECHNICAL FIELD

The present invention relates to a solid-state imaging apparatus, and more particularly to a stacked solid-state imaging apparatus.

BACKGROUND ART

PTL 1 describes a stacked solid-state imaging apparatus. The stacked solid-state imaging apparatus described in PTL 1 generates noise when resetting signal charges. Specifically, in the case where a shape of a reset pulse in the off is sharp, to which one of a source and a drain of a reset transistor charges on a channel move is randomly determined. Therefore, this appears as kTC noise. The kTC noise is also generated with capacitance coupling between a reset signal line and a pixel electrode, and the like.

In addition, a stacked solid-state imaging apparatus cannot completely cancel kTC noise even by using correlated double sampling. This is because, in the stacked solid-state imaging apparatus, charges cannot completely be transferred due to a structure in which a photoelectric conversion unit provided above a semiconductor substrate and the semiconductor substrate are connected to each other with a material having high conductivity, such as a metal. After the reset, next signal charges are added with the kTC noise remaining. Therefore, signal charges on which kTC noise is superimposed are read. Accordingly, the solid-state imaging apparatus described in PTL 1 has a problem of an increase in kTC noise.

For reducing kTC noise, a technique described in PTL 2 has been proposed.

FIG. 15 is a diagram illustrating a unit pixel and its peripheral circuit described in PTL 2. In a solid-state imaging apparatus described in PTL 2, a reset of signal charges generated by photodiode 512 are started by fully turning on row selection transistor 518 for unit pixel 510 on the selected row. Here, one terminal of amplifying transistor 514 for all unit pixels 510 on this row is connected to a low-impedance voltage source included in source power supply 530 via column signal line 524. Transistor 520 connected to source line 522 is biased as a current source with a waveform Vbias of gate 526. Amplifying transistor 514 and transistor 520 form an amplifier having a negative gain. A channel resistance of reset transistor 516 is changed by reduction reset power supply 550. Specifically, the channel resistance of reset transistor 516 is gradually increased by an application of a reset pulse, which is generated from reduction reset power supply 550 and has an inclined waveform, to the gate of reset transistor 516. The bandwidth of the kTC noise generated from reset transistor 516 is inversely proportional to the channel resistance of reset transistor 516. Therefore, the more the channel resistance increases, the more the bandwidth of the kTC noise decreases. Accordingly, when the bandwidth of the kTC noise is reduced to a bandwidth of the amplifier composed of amplifying transistor 514 and transistor 520, the kTC noise is suppressed by negative feedback from the amplifier.

CITATION LISTS

Patent Literatures

PTL 1: Unexamined Japanese Patent Publication No. S55-120182

PTL 2: Japanese Translation of PCT Publication No. 2002-510944

SUMMARY OF THE INVENTION

However, the technique described in PTL 2 activates load transistor 520 in a rated current region, so that a resistance between the source and the drain is restricted by a channel length modulation effect coefficient $\lambda$ of load transistor 520. Therefore, the resistance of load transistor 520 is decreased with microfabrication of a pixel. As a result, it becomes difficult to obtain a sufficient gain in a fine pixel, which deteriorates a noise suppression effect.

In view of the above problem, the present invention provides a solid-state imaging apparatus that can more significantly enhance a noise suppression effect than conventional apparatuses.

A solid-state imaging apparatus according to one aspect of the present invention includes: a pixel unit including a plurality of pixels arranged on a semiconductor substrate in a matrix, the pixel unit including for each column: a source line connected to one of a first power supply voltage and a reference potential; and a column signal line connected to one of a second power supply voltage and a signal output unit outputting a signal from the pixels, each of the pixels including: a photoelectric conversion unit that generates a signal charge corresponding to incident light; a charge storage unit connected to the photoelectric conversion unit; a reset transistor having a source and a drain, one of which is connected to the charge storage unit; an amplifying transistor having a gate that is connected to the charge storage unit, and having a source and a drain, one of which is connected to the source line; and a cutoff transistor having a source and a drain, one of which is connected to the other one of the source and the drain of the reset transistor and to the other one of the source and the drain of the amplifying transistor, and the other one of which is connected to the column signal line, wherein during a first period for discharging a charge in the charge storage unit, a potential between a third gate potential that allows the cutoff transistor to be conductive and a fourth gate potential that allows the cutoff transistor to be nonconductive is applied to a gate of the cutoff transistor, a first potential that allows the reset transistor to be conductive is applied to a gate of the reset transistor, the source line is connected to the reference potential, and the column signal line is connected to the second power supply voltage, and during a second period in which negative feedback is performed to the charge storage unit after the first period, a potential between the first gate potential and a second gate potential that allows the reset transistor to be nonconductive is applied to the gate of the reset transistor, and the fourth gate potential is applied to the gate of the cutoff transistor.

The solid-state imaging apparatus according to the present invention can significantly reduce kTC noise by using a negative feedback amplifying circuit.

DESCRIPTION OF EMBODIMENTS

Figure 1:
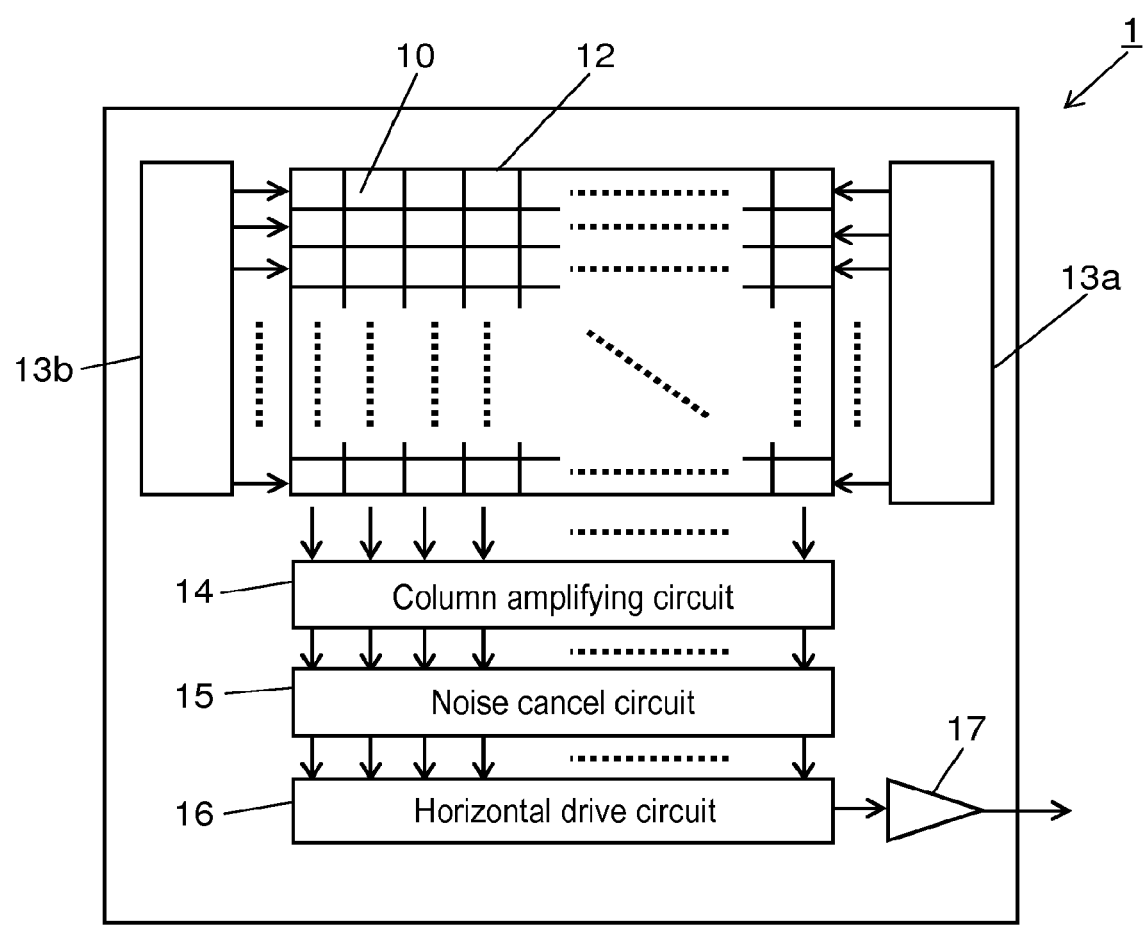
FIG. 1 is a block diagram illustrating an overall configuration of a solid-state imaging apparatus according to an exemplary embodiment of the present invention.

Exemplary embodiments of a solid-state imaging apparatus and its driving method according to the present invention will be described below with reference to the drawings. For simplifying the description, the components having substantially the same function are identified by the same reference numerals. It is to be noted that the present invention is not limited to the exemplary embodiments described below.

First Exemplary Embodiment

An overall configuration of a solid-state imaging apparatus according to a first exemplary embodiment will be described.

FIG. 1 is a block diagram illustrating an overall configuration of the solid-state imaging apparatus according to the first exemplary embodiment. Solid-state imaging apparatus 1 illustrated in FIG. 1 includes pixel unit 12 having a plurality of pixels 10 arranged in a matrix on a semiconductor substrate, row signal drive circuits 13a and 13b, column amplifying circuit 14 arranged for each column, noise cancel circuit 15, such as a correlated double sampling (CDS) circuit, arranged for each column, horizontal drive circuit 16, and output stage amplifier 17.

Figure 2:
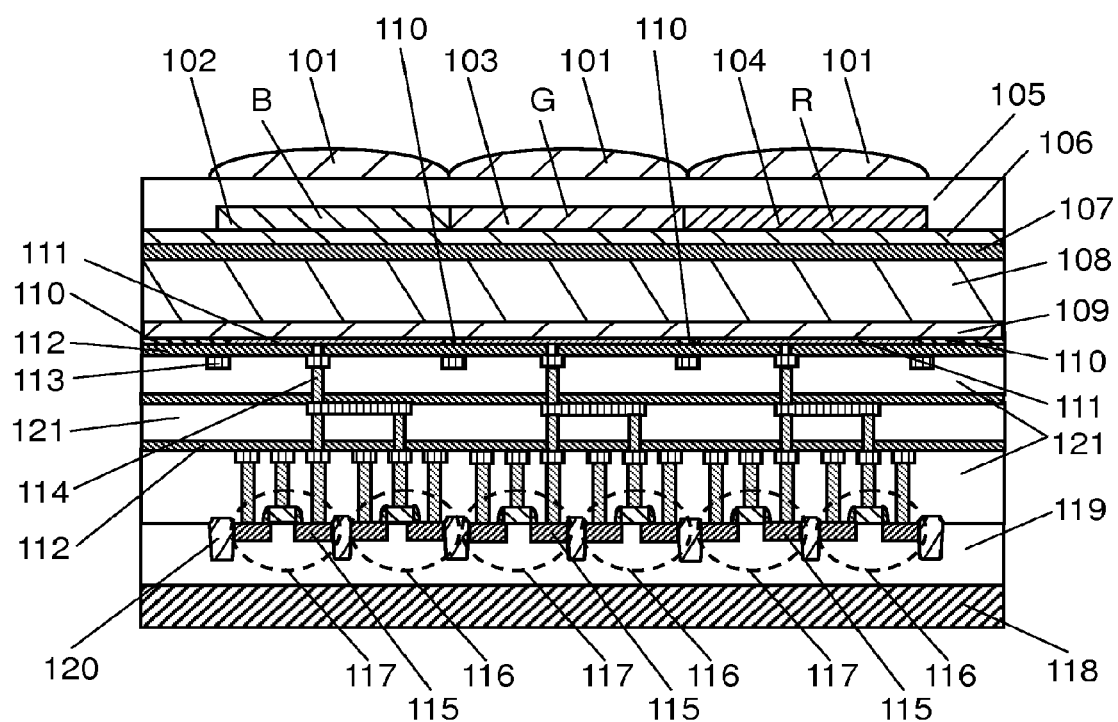
FIG. 2 is a sectional view illustrating the solid-state imaging apparatus according to the exemplary embodiment of the present invention.

FIG. 2 is a sectional view illustrating the structure of the solid-state imaging apparatus according to the first exemplary embodiment for three pixels. In an actual solid-state imaging apparatus, ten million pixels, for example, are arranged in the pixel unit 12 in a matrix. As illustrated in FIG. 2, solid-state imaging apparatus 1 includes microlens 101, red color filter 104, green color filter 103, blue color filter 102, protection film 105, flattening film 106, upper electrode 107, photoelectric conversion film 108, charge blocking layer 109, inter-electrode insulating film 110, lower electrode 111, inter-wiring insulating film 112, power feed layer 113, wiring layer 114, semiconductor substrate 118, well 119, STI (Shallow Trench Isolation) region 120, and interlayer insulating film 121.

Semiconductor substrate 118 is a silicon substrate, for example. P-type well 119 is formed on semiconductor substrate 118. STI region 120 for electrically isolating devices is formed on well 119. STI region 120 may be made of $SiO_2$, or may be composed of an isolation region into which high-concentration p-type impurities are doped. In well 119, charge storage unit 115, amplifying transistor 116, reset transistor 117, and a cutoff transistor that is not illustrated but formed in the same pixel are formed as a signal reading circuit. Although the conductive type of well 119 is set as P-type, it may be N-type.

Microlens 101 is formed on the uppermost surface of solid-state imaging apparatus 1 for each pixel 10 for efficiently collecting incident light.

Red color filter 104, green color filter 103, and blue color filter 102 are formed to capture a color image. Red color filter 104, green color filter 103, and blue color filter 102 are formed just below each microlens 101 and in protection film 105. These optical elements are formed on flattening film 106 for forming microlenses 101 and color filter group free from unevenness in light collection and color unevenness for ten million pixels. Flattening film 106 is made of SiN, for example.

Upper electrode 107 is formed below flattening film 106 and on the surface of photoelectric conversion film 108 opposite to lower electrode 111 over the entire surface of pixel unit 12. This upper electrode 107 is a transparent electrode transmitting visible light. For example, upper electrode 107 is made of ITO (Indium Tin Oxide).

Photoelectric conversion film 108 converts light into a signal charge. Specifically, photoelectric conversion film 108 is formed below upper electrode 107, and is made of organic molecule having high light absorptive capacity. The thickness of photoelectric conversion film 108 is about 500 nm, for example. In addition, photoelectric conversion film 108 is formed by a vacuum deposition process, for example. The organic molecule described above has high light absorptive capacity throughout the entire region of visible light with a wavelength of about 400 nm to about 700 nm.

Charge blocking layer 109 is formed below photoelectric conversion film 108, and it conducts a signal charge generated by photoelectric conversion of incident light and blocks charge injection from lower electrode 111. Charge blocking layer 109 is formed on inter-electrode insulating film 110 having high flatness and lower electrode 111. Charge blocking layer 109 is made of an organic material, for example.

A plurality of lower electrodes 111 are pixel electrodes arranged in a matrix above semiconductor substrate 118 and on a surface of photoelectric conversion film 108 close to semiconductor substrate 118. The plurality of lower electrodes 111 are electrically separated from each other at an interval of about 0.2 μm. Specifically, lower electrodes 111 are formed in inter-electrode insulating film 110 for collecting a signal charge generated from photoelectric conversion film 108. This lower electrode 111 is made of TiN, for example. Lower electrode 111 is also formed on flattened inter-wiring insulating film 112 with a thickness of about 100 nm.

Power feed layer 113 is provided below inter-electrode insulating film 110 and under inter-wiring insulating film 112. This power feed layer 113 is made of Cu, for example. Specifically, power feed layer 113 is formed between lower electrodes 111, which are adjacent to each other, and between lower electrode 111 and semiconductor substrate 118. Potential independent of lower electrode 111 can be supplied to power feed layer 113. Specifically, potential for discharging a signal charge is supplied to power feed layer 113 during an exposure operation in which photoelectric conversion film 108 performs photoelectric conversion and during a reading operation in which the signal reading circuit generates a pixel signal corresponding to an amount of signal charge. For example, when a signal charge is a hole, a positive voltage is applied. This configuration can prevent a signal charge from entering each pixel from the adjacent pixel. The control for a voltage application to power feed layer 113 is performed by a control unit (not illustrated) in solid-state imaging apparatus 1, for example.

Wiring layer 114 is connected to charge storage unit 115 and a gate of amplifying transistor 116 of the signal reading circuit. Charge storage unit 115 is a charge storage unit electrically connected to lower electrode 111, for storing a signal charge from photoelectric conversion film 108, and also serves as one of a source and a drain of reset transistor 117. The signal reading circuit formed in well 119 detects a change in a current or a voltage generated in each of the plurality of lower electrodes 111, thereby generating a pixel signal corresponding to an amount of signal charge.

Figure 3:
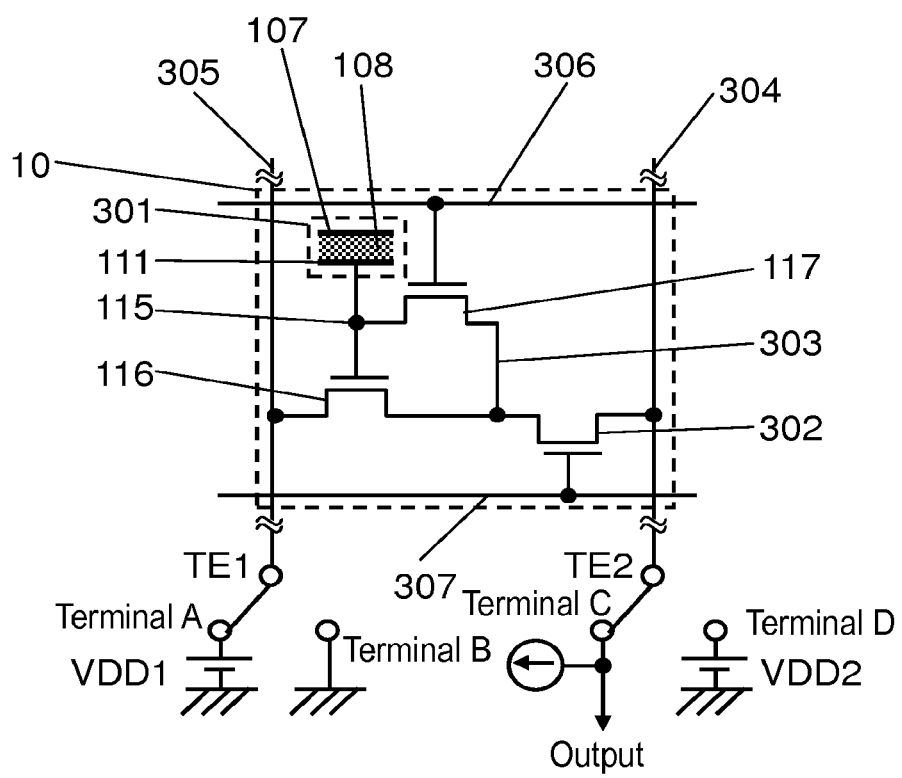
FIG. 3 is a circuit diagram of a pixel and a control circuit of the solid-state imaging apparatus according to the first exemplary embodiment.

FIG. 3 is a diagram illustrating one example of a circuit of pixel 10 belonging to an mth row (m is a natural number) and an nth column (n is a natural number) of pixel unit 12, and its control circuit according to the first exemplary embodiment.

Pixel 10 includes photoelectric conversion unit 301 generating a signal charge corresponding to incident light, charge storage unit 115 connected to photoelectric conversion unit 301, amplifying transistor 116, cutoff transistor 302, and reset transistor 117. Pixel unit 12 includes, for each column, source line 305 connected to one of first power supply voltage VDD1 or a reference potential, and column signal line 304 connected to one of second power supply voltage VDD2 and a signal output unit outputting a signal from a pixel. Pixels 10 belonging to the same column are commonly connected to column signal line 304. Pixel 10 belonging to the same column is commonly connected to source line 305. Notably, the present specification describes that first power supply voltage VDD1 and second power supply voltage VDD2 are different. However, they may be the same power supply voltage.

Photoelectric conversion unit 301 includes upper electrode 107, photoelectric conversion film 108, and lower electrode 111. Photoelectric conversion unit 301 photoelectrically converts incident light to generate a signal charge corresponding to a quantity of incident light. Since upper electrode 107 is biased to a predetermined bias level, it can transfer signal charges to charge storage unit 115 via lower electrode 111.

The gate of amplifying transistor 116 is connected to charge storage unit 115. One of the source and the drain of amplifying transistor 116 is connected to source line 305. Amplifying transistor 116 outputs a voltage corresponding to the signal charge.

One of a source and a drain of reset transistor 117 is connected to charge storage unit 115. Other one 303 of the source and the drain of reset transistor 117 and the other one of the source and the drain of amplifying transistor 116 are connected to one of a source and a drain of cutoff transistor 302. Reset transistor 117 resets a potential of charge storage unit 115.

One of the source and the drain of cutoff transistor 302 is connected to other one 303 of the source and the drain of reset transistor 117. The other one of the source and the drain of cutoff transistor 302 is connected to column signal line 304. Cutoff transistor 302 performs a first operation for outputting an output voltage from amplifying transistor 116 to column signal line 304, a second operation for allowing amplifying transistor 116 and column signal line 304 to be nonconductive, and a third operation acting as a resistor.

One end of source line 305 is connected to first power supply voltage VDD1 (terminal A) or the reference potential (terminal B) via terminal TE1.

One end of column signal line 304 is connected to the signal output unit (terminal C) or second power supply voltage VDD2 (terminal D) via terminal TE2.

Although the transistor composing pixel 10 is an NMOS transistor in the first exemplary embodiment, the polarity may be inverted. Specifically, a transistor composing pixel 10 may be a PMOS transistor.

Figure 4:
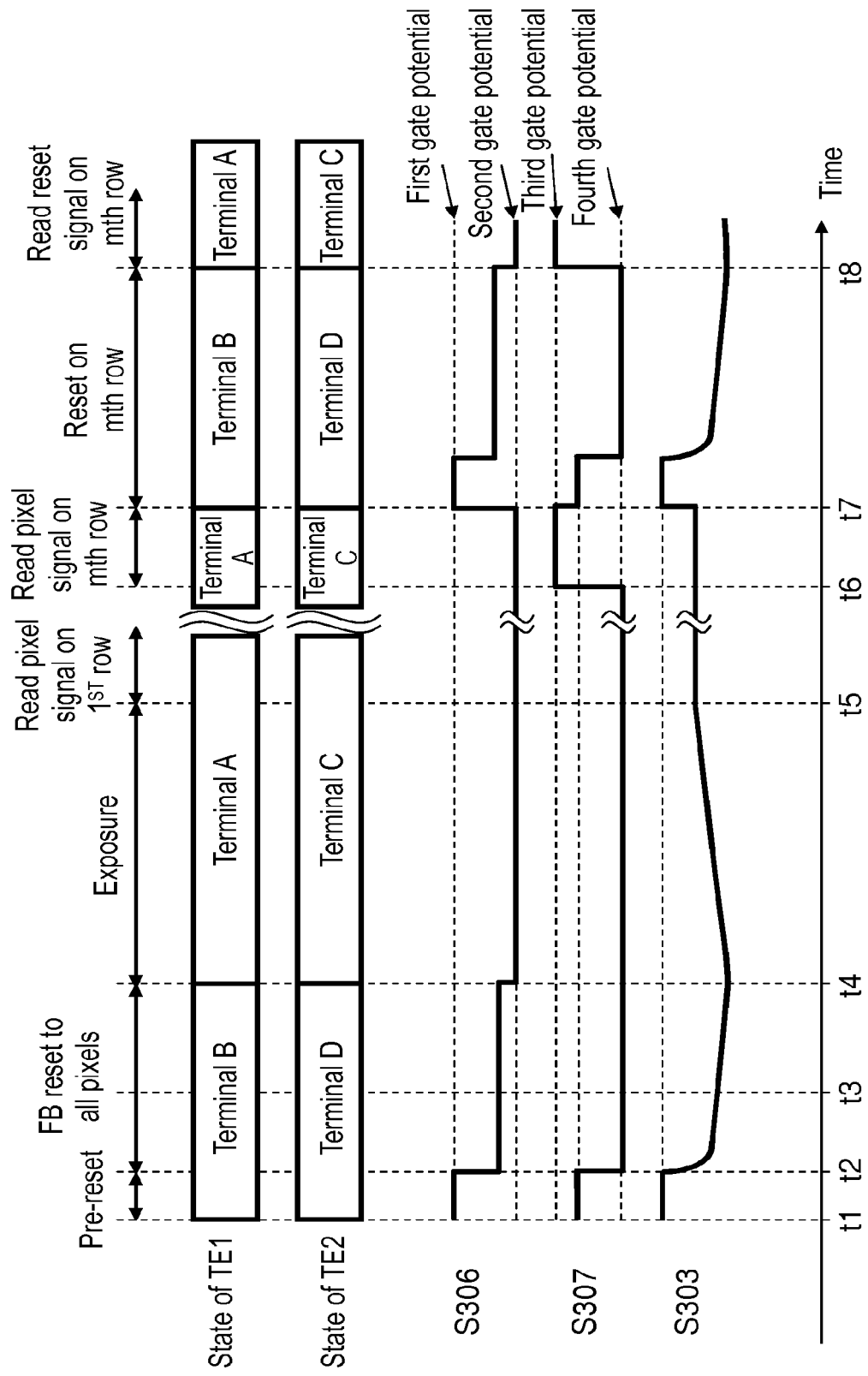
FIG. 4 is a timing chart illustrating a driving method of the solid-state imaging apparatus according to the first exemplary embodiment.

FIG. 4 is a timing chart illustrating a driving method for pixels on the mth row including pixel 10 illustrated in FIG. 3 and its control circuit. In the present specification, a "high level" potential applied to the gate of the NMOS transistor is a gate potential that allows the NMOS transistor to be conductive. A "low level" potential applied to the gate of the NMOS transistor is a gate potential that allows the NMOS transistor to be nonconductive. In a PMOS transistor, a "high level" and a "low level" are switched.

In the present specification, a gate potential that allows the reset transistor to be conductive is also defined as a "first gate potential", and a gate potential that allows the reset transistor to be nonconductive is also defined as a "second gate potential". Similarly, a gate potential that allows the cutoff transistor to be conductive is also defined as a "third gate potential", a gate potential that allows the cutoff transistor to be nonconductive is also defined as a "fourth gate potential", a gate potential that allows the selection transistor to be conductive is also defined as a "fifth gate potential", and a gate potential that allows the selection transistor to be nonconductive is also defined as a "sixth gate potential".

Control signal S306 is applied to the gate of reset transistor 117 from reset transistor control line 306. Control signal S307 is applied to the gate of cutoff transistor 302 from cutoff transistor control line 307.

Next, the timing chart of FIG. 4 will be described in time series.

Firstly, source line 305 is connected to the reference potential (terminal B) via terminal TE1 during a first period (times t1 to t2: pre-reset period) for discharging a charge in charge storage unit 115. Column signal line 304 is connected to second power supply voltage VDD2 (terminal D) via terminal TE2. Since control signal S306 is in a high level (first gate potential), reset transistor 117 is conductive. Since control signal S307 has a potential between a high level (third gate potential) and a low level (fourth gate potential), cutoff transistor 302 acts as a resistor. In this case, a voltage obtained by subtracting a voltage drop due to a resistance by cutoff transistor 302 from second power supply voltage VDD2 is applied to charge storage unit 115 and potential S303 of other one 303 of the source and the drain of reset transistor 117.

Subsequently, during a second period (times t2 to t4: feedback reset period) in which a negative feedback is performed to charge storage unit 115 after the first period (pre-reset period), control signal S306 is set to a voltage between a high level and a low level, so that channel resistance of reset transistor 117 increases. The bandwidth of kTC noise generated from charge storage unit 115 is represented by an inverse number of time constant RC (R: resistance, C: capacitance). Therefore, the larger channel resistance R of reset transistor 117 is, the smaller the bandwidth of the kTC noise is. Cutoff transistor 302 is nonconductive because control signal S307 is in a low level. Source line 305 is still connected to the reference potential (terminal B). In this case, column signal line 304 can be connected to the signal output unit (terminal C) or second power supply voltage VDD2 (terminal D), because cutoff transistor 302 is nonconductive. In the present exemplary embodiment, column signal line 304 is connected to second power supply voltage VDD2.

At time t2, discharge to the reference potential (terminal B) occurs from other one 303 of the source and the drain of reset transistor 117 via amplifying transistor 116. Accordingly, potential S303 of other one 303 of the source and the drain of reset transistor 117 lowers.

At time t3, potential S303 becomes lower than the channel potential below the gate of reset transistor 117. Therefore, carriers are injected to charge storage unit 115 from other one 303 of the source and the drain of reset transistor 117 via reset transistor 117.

In this case a signal with an opposite phase is transmitted by a negative feedback of the amplifying circuit in which the gate of amplifying transistor 116 is regarded as an input and nonconductive cutoff transistor 302 is regarded as a load, whereby kTC noise from charge storage unit 115 can be canceled. In general, frequency characteristics of an amplifying circuit exhibit characteristics of a low-pass filter. Therefore, a gain might be reduced outside an operating band of the amplifying circuit. From this, the reduction in the gain of the amplifying circuit can be prevented by lowering the bandwidth of kTC noise to the range within the operating band of the amplifying circuit.

In addition, because cutoff transistor 302 serving as a load of the amplifying circuit is nonconductive, a resistance can be regarded as infinite without being affected by a channel length modulation effect coefficient, different from PTL 2. Since the gain of the amplifying circuit is in proportion to the resistance of cutoff transistor 302, the gain can be set large even with a negative feedback circuit. Consequently, kTC noise from charge storage unit 115 can be reduced more than the circuit described in PTL 2.

In the system described in PTL 2, a flowing current when reset is about 6 uA per one pixel. Therefore, when 12 million pixels are simultaneously reset, i.e., global reset is performed, current as high as 72 A is needed, and this is substantially impossible with a general power supply. On the other hand, in the circuit according to the present exemplary embodiment, pixel 10 is isolated from second power supply voltage VDD2 by cutoff transistor 302. With this, only a discharge of the capacitance from photoelectric conversion unit 301 or other one 303 of the source and the drain flows. Accordingly, the flowing current when reset is suppressed to about 100 pA per one pixel, whereby global reset can be implemented. This can consequently prevent an occurrence of image distortion in reproducing a still image of a subject that is moving with high speed.

Subsequently, during a third period (times t4 to t5: exposure period) for generating a signal charge in photoelectric conversion unit 301 after the second period (feedback reset period), photoelectric conversion unit 301 and both column signal line 304 and source line 305 are not electrically connected to each other. Therefore, source line 305 can be connected to the first power supply voltage (terminal A) or to the reference potential (terminal B), and column signal line 304 can be connected to the signal output unit (terminal C) or second power supply voltage VDD2 (terminal D). In the present exemplary embodiment, source line 305 is connected to first power supply voltage VDD1 (terminal A) via terminal TE1, and column signal line 304 is connected to the signal output unit (terminal C) via terminal TE2 for preparation of the next readout.

In this case, reset transistor 117 and cutoff transistor 302 are nonconductive, because control signal S306 and control signal S307 are both in a low level.

Then, during a fourth period (times t6 to t7: pixel signal reading period) for reading a pixel signal corresponding to a signal charge of pixel 10 arranged in the mth row to column signal line 304 after the third period (exposure period), reset transistor 117 is nonconductive, because control signal S306 is in a low level. Due to control signal S307 in a high level, cutoff transistor 302 of pixel 10 on the mth row becomes conductive. As a result, a pixel signal corresponding to an amount of signal charge generated from photoelectric conversion unit 301 of pixel 10 on the mth row is read to column signal line 304. In this case, source line 305 is connected to first power supply voltage VDD1 (terminal A) via terminal TE1, and column signal line 304 is connected to the signal output unit (terminal C) via terminal TE2.

During a fifth period (times t7 to t8: mth-row pixel reset) for resetting the potential of charge storage unit 115 of pixel 10 arranged in the mth row after the fourth period (pixel signal reading period), the potential of charge storage unit 115 of pixel 10 on the mth row is reset by the drive similar to the drive during times t1 to t4.

During a sixth period (time t8~: mth-row pixel reset signal readout) for reading a reset signal of pixel 10 arranged in the mth row to column signal line 304 after the fifth period (mth-row pixel reset), a low-level potential is applied to the gate of reset transistor 117 of pixel 10 arranged in the mth row. A high-level potential is applied to the gate of cutoff transistor 302 of pixel 10 arranged in the mth row. Source line 305 is connected to first power supply voltage VDD1 (terminal A) via terminal TE1. Since column signal line 304 is connected to the signal output unit (terminal C) via terminal TE2, the reset signal from pixel 10 is read to column signal line 304.

Then, a difference between the pixel signal read during the fourth period and the reset signal read during the sixth period is obtained by noise cancel circuit 15.

The solid-state imaging apparatus according to the first exemplary embodiment allows cutoff transistor 302 to be nonconductive when resetting charge storage unit 115, thereby being capable of increasing the gain of the negative feedback circuit. Consequently, the solid-state imaging apparatus can attain a kTC noise suppression effect higher than the conventional circuit.

Second Exemplary Embodiment

Figure 5:
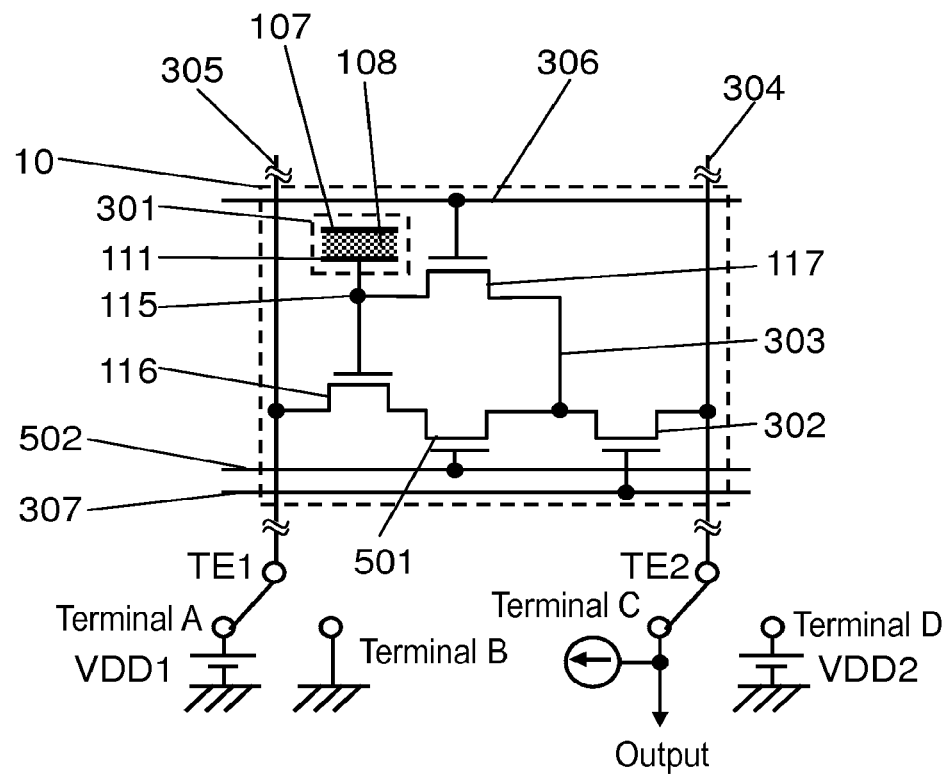
FIG. 5 is a circuit diagram of a pixel and a control circuit of a solid-state imaging apparatus according to a second exemplary embodiment.

FIG. 5 is a diagram illustrating one example of a circuit of pixel 10 belonging to an mth row (m is a natural number) and an nth column (n is a natural number) of pixel unit 12, and its control circuit according to a second exemplary embodiment.

The different point from the circuit structure according to the first exemplary embodiment is such that amplifying transistor 116 is connected to cutoff transistor 302 via selection transistor 501. Specifically, one of a source and a drain of selection transistor 501 is connected to the other one of the source and the drain of amplifying transistor 116. The other one of the source and the drain of selection transistor 501 is connected to one of the source and the drain of cutoff transistor 302. The other one of the source and the drain of selection transistor 501 is connected to other one 303 of the source and the drain of reset transistor 117.

Figure 6:
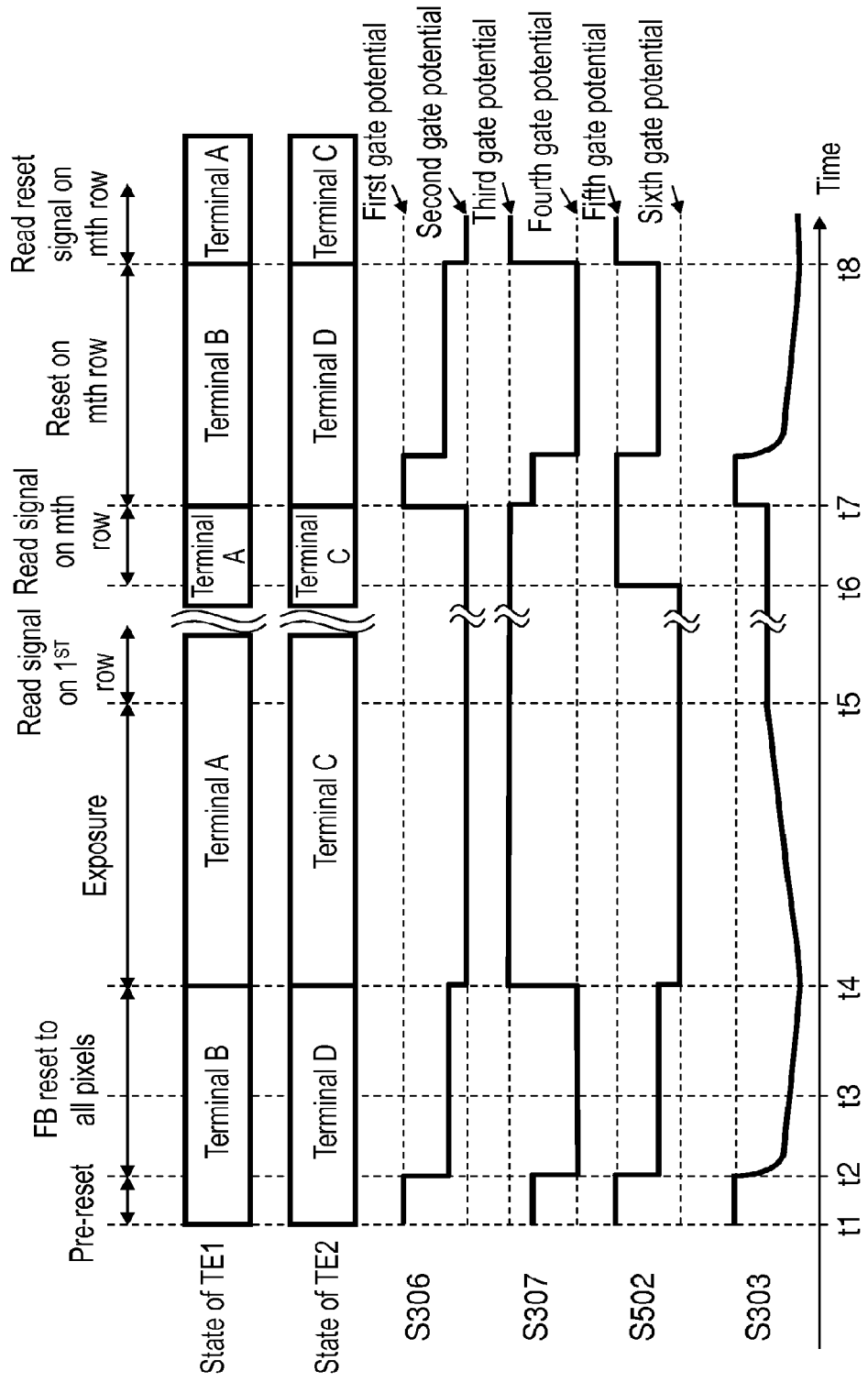
FIG. 6 is a timing chart illustrating a driving method of the solid-state imaging apparatus according to the second exemplary embodiment.

FIG. 6 is a timing chart illustrating a driving method for pixels on the mth row including pixel 10 illustrated in FIG. 5 and its control circuit. Control signal S502 is applied to the gate of selection transistor 501 from selection transistor control line 502.

The timing chart of FIG. 6 will be described in time series.

Firstly, source line 305 is connected to the reference potential (terminal B) via terminal TE1 during a first period (times t1 to t2: pre-reset period) for discharging a charge in charge storage unit 115. Column signal line 304 is connected to second power supply voltage VDD2 (terminal D) via terminal TE2. Since control signal S502 is in a high level (fifth gate potential), selection transistor 501 is conductive. Since control signal S307 has a potential between a high level (third gate potential) and a low level (fourth gate potential), cutoff transistor 302 acts as a resistor. In this case, a voltage obtained by subtracting a voltage drop due to a resistance by cutoff transistor 302 from second power supply voltage VDD2 is applied to charge storage unit 115, potential S303 of other one 303 of the source and the drain of reset transistor 117, and one of the source and the drain of selection transistor 501.

Subsequently, during a second period (times t2 to t4: feedback reset period) in which a negative feedback is performed to charge storage unit 115 after the first period (pre-reset period), control signal S502 is set to a voltage between a high level and a low level (sixth gate potential), so that selection transistor 501 acts as a cascode transistor. Since control signal S306 is set to a potential between a high level (first gate potential) and a low level (second gate potential), the channel resistance of reset transistor 117 increases, and hence, the bandwidth of kTC noise decreases. Cutoff transistor 302 is set nonconductive because control signal S307 is in a low level. Source line 305 is still connected to the reference potential (terminal B). In this case, column signal line 304 can be connected to the signal output unit (terminal C) or second power supply voltage VDD2 (terminal D), because cutoff transistor 302 is nonconductive. In the present exemplary embodiment, column signal line 304 is connected to second power supply voltage VDD2.

At time t2, discharge to the reference potential (terminal B) occurs from other one 303 of the source and the drain of reset transistor 117 via amplifying transistor 116. With this, potential S303 of other one 303 of the source and the drain of reset transistor 117 lowers.

At time t3, potential S303 becomes lower than the channel potential below the gate of reset transistor 117. Therefore, carriers are injected to charge storage unit 115 from other one 303 of the source and the drain of reset transistor 117 via reset transistor 117.

In this case, a signal with an opposite phase is transmitted by a negative feedback of the cascode amplifying circuit in which the gate of amplifying transistor 116 is regarded as an input, selection transistor 501 is regarded as a cascode transistor, and nonconductive cutoff transistor 302 is regarded as a load, whereby kTC noise from charge storage unit 115 can be canceled.

In addition, because cutoff transistor 302 serving as a load of the amplifying circuit is nonconductive, a resistance can be regarded as infinite without being affected by a channel length modulation effect coefficient. Since the gain of the amplifying circuit is in proportion to the resistance of cutoff transistor 302, the gain can be set large even with a negative feedback circuit. In addition, selection transistor 501 is operated as a cascode transistor, whereby an apparent source-drain conductance of amplifying transistor 116 can be reduced. Accordingly, the gain can be increased more than the first exemplary embodiment. Consequently, kTC noise from charge storage unit 115 can be reduced more than the circuit according to the first exemplary embodiment.

Further, global reset can be implemented in accordance with a principle similar to the first exemplary embodiment. This can consequently prevent an occurrence of image distortion in reproducing a still image of a subject that is moving with high speed.

Subsequently, during a third period (times t4 to t5: exposure period) for generating a signal charge in photoelectric conversion unit 301 after the second period (feedback reset period), photoelectric conversion unit 301 and both column signal line 304 and source line 305 are not electrically connected to each other. Therefore, source line 305 can be connected to the first power supply voltage (terminal A) or to the reference potential (terminal B), and column signal line 304 can be connected to the signal output unit (terminal C) or second power supply voltage VDD2 (terminal D). In the present exemplary embodiment, source line 305 is connected to first power supply voltage VDD1 (terminal A) via terminal TE1, and column signal line 304 is connected to the signal output unit (terminal C) via terminal TE2 for preparation of the next readout.

Then, during a fourth period (times t6 to t7: pixel signal reading period) for reading a pixel signal corresponding to a signal charge of pixel 10 arranged in the mth row to column signal line 304 after the third period (exposure period), selection transistor 501 of pixel 10 on the mth row becomes conductive, because control signal S502 is in a high level. Cutoff transistor 302 is still conductive because control signal S307 is in a high level. As a result, pixel signals corresponding to an amount of signal charge generated from photoelectric conversion units 301 of a plurality of pixels on the mth row are read to column signal line 304. In this case, source line 305 is connected to first power supply voltage VDD1 (terminal A) via terminal TE1, and column signal line 304 is connected to the signal output unit (terminal C) via terminal TE2.

During a fifth period (times t7 to t8: mth-row pixel reset) for resetting the potential of charge storage unit 115 of pixel 10 arranged in the mth row after the fourth period (pixel signal reading period), the potential of charge storage unit 115 of pixel 10 on the mth row is reset by the drive similar to the drive during times t1 to t4.

During a sixth period (time t8~: mth-row pixel reset signal readout) for reading a reset signal of pixel 10 arranged in the mth row to column signal line 304 after the fifth period (mth-row pixel reset), a low-level potential is applied to the gate of reset transistor 117 of pixel 10 arranged in the mth row. A high-level potential is applied to the gate of cutoff transistor 302 and the gate of selection transistor 501 of pixel 10 arranged in the mth row. Source line 305 is connected to first power supply voltage VDD1 (terminal A) via terminal TEL Since column signal line 304 is connected to the signal output unit (terminal C) via terminal TE2, the signal from pixel 10 is read to column signal line 304.

Then, a difference between the pixel signal read during the fourth period and the reset signal read during the sixth period is obtained by noise cancel circuit 15.

The solid-state imaging apparatus according to the second exemplary embodiment forms a negative feedback cascode amplifying circuit when resetting charge storage unit 115, thereby being capable of increasing the gain. Accordingly, the solid-state imaging apparatus according to the second exemplary embodiment can attain a kTC noise suppression effect much higher than the solid-state imaging apparatus according to the first exemplary embodiment.

Third Exemplary Embodiment

Next, a third exemplary embodiment will be described.

Figure 7:
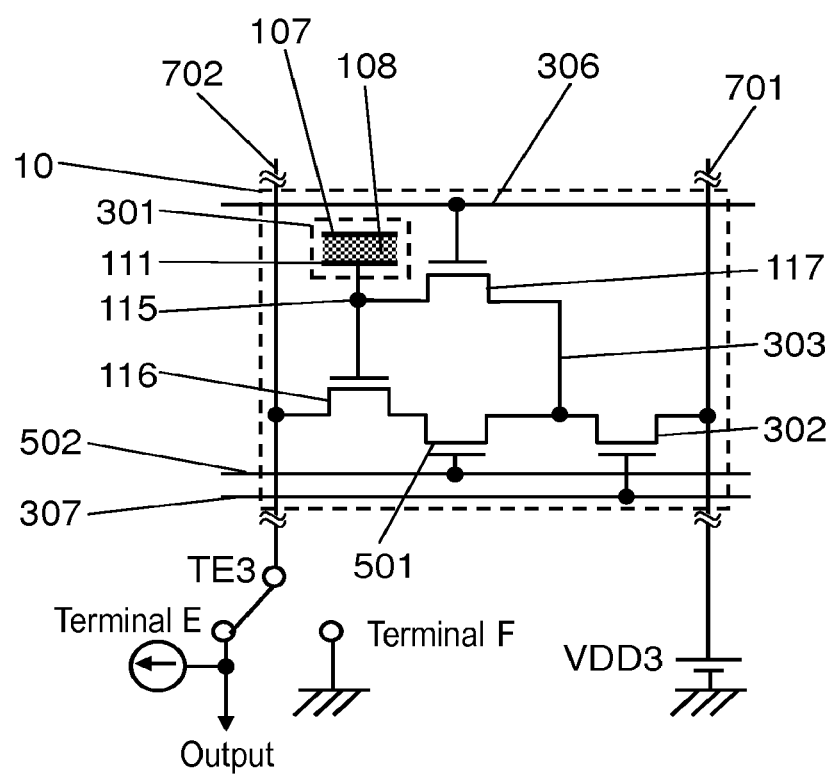
FIG. 7 is a circuit diagram of a pixel and a control circuit of a solid-state imaging apparatus according to a third exemplary embodiment.

FIG. 7 is a diagram illustrating one example of a circuit of pixel 10 belonging to an mth row (m is a natural number) and an nth column (n is a natural number) of pixel unit 12, and its control circuit according to a third exemplary embodiment.

The pixel unit 12 includes, for each column, a column signal line 702 which is connected to a reference potential or outputs a pixel signal from the pixel 10, and a source line 701 connected to third power supply voltage VDD3. One of the source and the drain of amplifying transistor 116 is connected to column signal line 702. The other one of the source and the drain of cutoff transistor 302 is connected to source line 701. One end of column signal line 702 is connected to a signal output unit (terminal E) or a reference potential (terminal F) via terminal TE3. Source line 701 and column signal line 702 provided for each column are commonly connected to a plurality of pixels 10 belonging to the nth column.

The circuit according to the third exemplary embodiment can reduce the number of switches more than the circuit according to the second exemplary embodiment, thereby being advantageous for microfabrication of a solid-state imaging apparatus.

Figure 8:
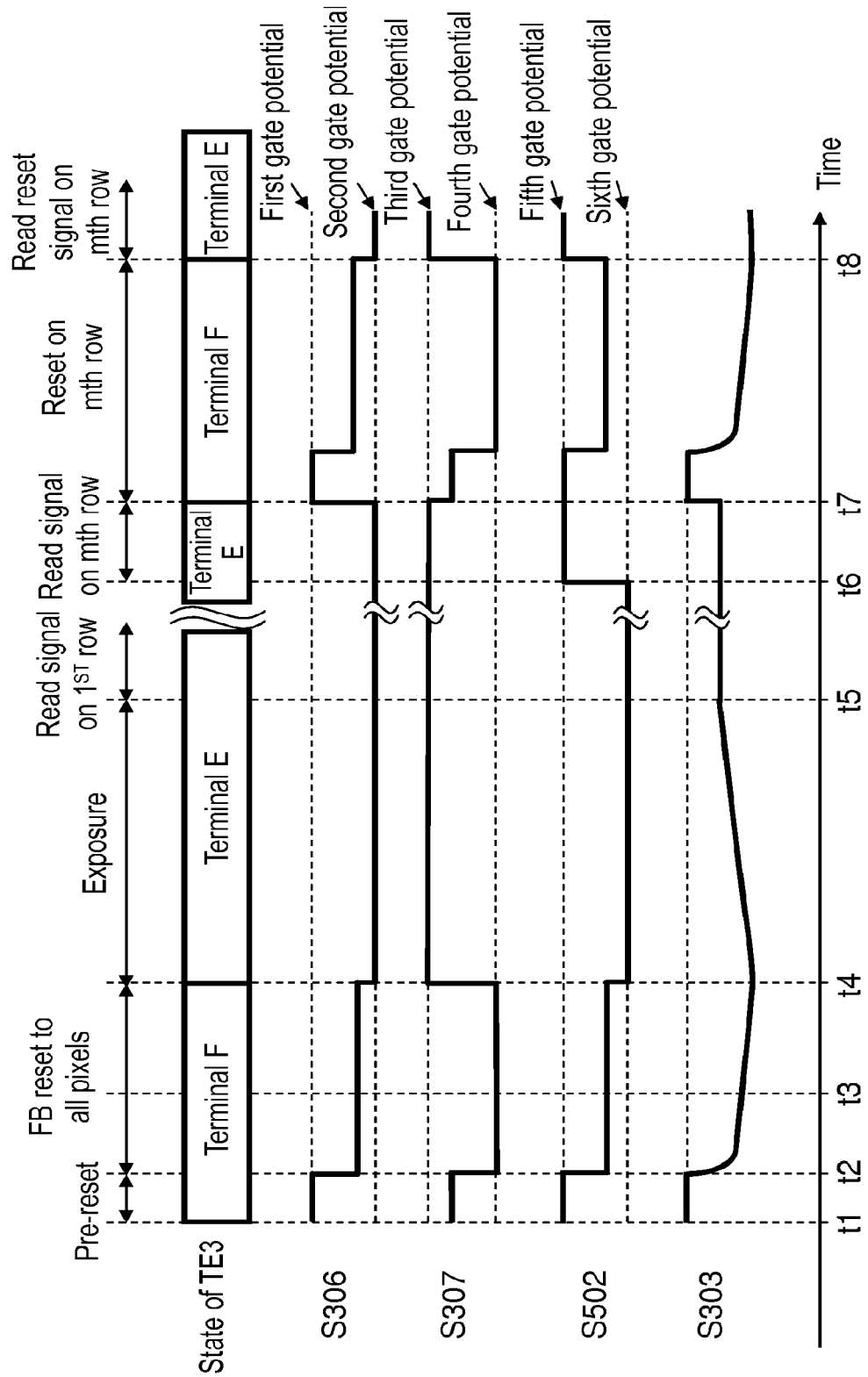
FIG. 8 is a timing chart illustrating a driving method of the solid-state imaging apparatus according to the third exemplary embodiment.

FIG. 8 is a timing chart illustrating a driving method for pixels on the mth row including pixel 10 illustrated in FIG. 7 and its control circuit.

The timing chart of FIG. 8 will be described in time series.

Firstly, column signal line 702 is connected to the reference potential (terminal F) via terminal TE3 during a first period (times t1 to t2: pre-reset period) for discharging a charge in a charge storage unit. Since control signal S502 is in a high level (fifth gate potential), selection transistor 501 is conductive. Since control signal S306 is in a high level (first gate potential), reset transistor 117 is conductive. Since control signal S307 has a potential between a high level (third gate potential) and a low level (fourth gate potential), cutoff transistor 302 acts as a resistor. In this case, a voltage obtained by subtracting a voltage drop due to a resistance by cutoff transistor 302 from third power supply voltage VDD3 is applied to charge storage unit 115, potential S303 of other one 303 of the source and the drain of reset transistor 117, and one of the source and the drain of selection transistor 501.

Subsequently, during a second period (times t2 to t4: feedback reset period) in which a negative feedback is performed to charge storage unit 115 after the first period (pre-reset period), control signal S502 is set to a voltage between a high level and a low level (sixth gate potential), so that selection transistor 501 acts as a cascode transistor. Since control signal S306 is set to a potential between a high level and a low level (second gate potential), the channel resistance of reset transistor 117 increases. As a result, the bandwidth of kTC noise generated from charge storage unit 115 decreases. Cutoff transistor 302 is set nonconductive because control signal S307 is in a low level. Column signal line 702 is still connected to the reference potential.

At time t2, a noise suppression action for charge storage unit 115 is performed in all pixels 10. Discharge to the reference potential (terminal F) occurs from other one 303 of the source and the drain of reset transistor 117 via amplifying transistor 116. Accordingly, potential S303 of other one 303 of the source and the drain of reset transistor 117 lowers.

At time t3, potential S303 becomes lower than the channel potential below the gate of reset transistor 117. Therefore, carriers are injected to charge storage unit 115 from other one 303 of the source and the drain of reset transistor 117 via reset transistor 117.

In this case, a signal with an opposite phase is transmitted by a negative feedback of the cascode amplifying circuit in which the gate of amplifying transistor 116 is regarded as an input, selection transistor 501 is regarded as a cascode transistor, and nonconductive cutoff transistor 302 is regarded as a load, whereby kTC noise from charge storage unit 115 can be canceled.

In addition, because cutoff transistor 302 serving as a load of the amplifying circuit is nonconductive, a resistance can be regarded as infinite without being affected by a channel length modulation effect coefficient. Since the gain of the amplifying circuit is in proportion to the resistance of cutoff transistor 302, the gain can be set large even with a negative feedback circuit. In addition, selection transistor 501 is operated as a cascode transistor, whereby an apparent source-drain conductance of amplifying transistor 116 can be reduced. Accordingly, the gain can be increased more than the first exemplary embodiment. Consequently, kTC noise from charge storage unit 115 can be reduced more than the circuit according to the first exemplary embodiment.

Further, global reset can be implemented in accordance with a principle similar to the first exemplary embodiment. This can consequently prevent an occurrence of image distortion in reproducing a still image of a subject that is moving with high speed.

Subsequently, during a third period (times t4 to t5: exposure period) for generating a signal charge in photoelectric conversion unit 301 after the second period (feedback reset period), control signal S306 and control signal S502 become low level, so that reset transistor 117 and selection transistor 501 become nonconductive. In this case, column signal line 702 is connected to the signal output unit (terminal E) via terminal TE3 for preparation of a signal reading operation.

Then, during a fourth period (times t6 to t7: pixel signal reading period) for reading a pixel signal corresponding to the signal charge of pixel 10 arranged in the mth row to column signal line 702 after the third period (exposure period), selection transistor 501 of pixel 10 on the mth row becomes conductive, because control signal S502 is in a high level. As a result, a pixel signal corresponding to an amount of signal charge generated from photoelectric conversion unit 301 of a plurality of pixels on the mth row is read to column signal line 702.

During a fifth period (times t7 to t8: mth-row pixel reset) for resetting the potential of charge storage unit 115 of pixel 10 arranged in the mth row after the fourth period (pixel signal reading period), the potential of charge storage unit 115 of pixel 10 on the mth row is reset by the drive similar to the drive during times t1 to t4.

During a sixth period (time t8~: mth-row pixel reset signal readout) for reading a reset signal of pixel 10 arranged in the mth row to column signal line 702 after the fifth period (mth-row pixel reset), a low-level potential is applied to the gate of reset transistor 117 of pixel 10 arranged in the mth row. A high-level potential is applied to the gate of cutoff transistor 302 and the gate of selection transistor 501 of pixel 10 arranged in the mth row. This allows cutoff transistor 302 and selection transistor 501 to become conductive. Since column signal line 702 is connected to the signal output unit (terminal E) via terminal TE3, the signal from pixel 10 is read to column signal line 702.

Then, a difference between the pixel signal read during the fourth period and the reset signal read during the sixth period is obtained by noise cancel circuit 15.

The solid-state imaging apparatus according to the third exemplary embodiment forms a negative feedback cascode amplifying circuit when resetting charge storage unit 115, thereby being capable of increasing the gain. Accordingly, the solid-state imaging apparatus according to the third exemplary embodiment can attain a kTC noise suppression effect much higher than the solid-state imaging apparatus according to the first exemplary embodiment.

Fourth Exemplary Embodiment

Next, a fourth exemplary embodiment will be described.

Figure 9:
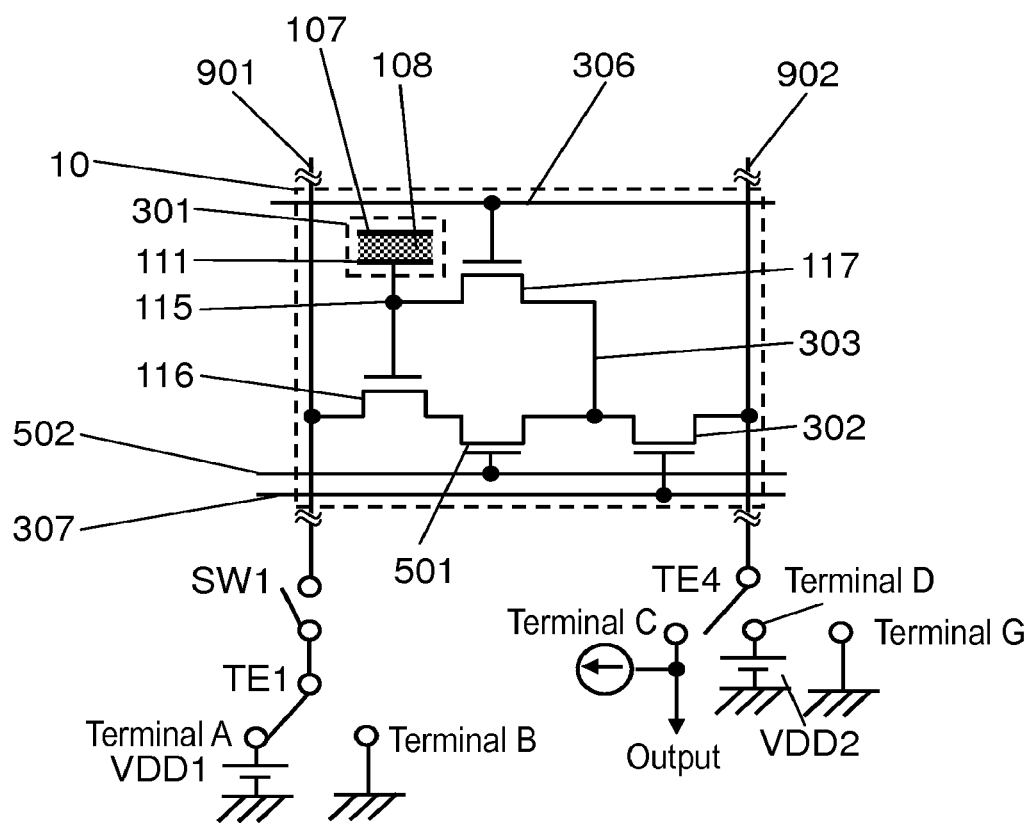
FIG. 9 is a circuit diagram of a pixel and a control circuit of a solid-state imaging apparatus according to a fourth exemplary embodiment.

FIG. 9 is a diagram illustrating one example of a circuit of pixel 10 belonging to an mth row (m is a natural number) and an nth column (n is a natural number) of pixel unit 12, and its control circuit according to the fourth exemplary embodiment.

Source line 901 is connected to first power supply voltage VDD1 (terminal A) or a reference potential (terminal B) via switch SW1. Specifically, one end of source line 901 is connected to terminal TE1 via switch SW1. It is then connected to first power supply voltage VDD1 (terminal A) or the reference potential (terminal B) via terminal TEL One of a source and a drain of amplifying transistor 116 is connected to source line 901.

Column signal line 902 can also be connected to the reference potential. Specifically, one end of column signal line 902 can be connected to any one of a signal output unit (terminal C), second power supply voltage VDD2 (terminal D), and a reference potential (terminal G) via terminal TE4. The other one of a source and a drain of cutoff transistor 302 is connected to column signal line 902.

Figure 10:
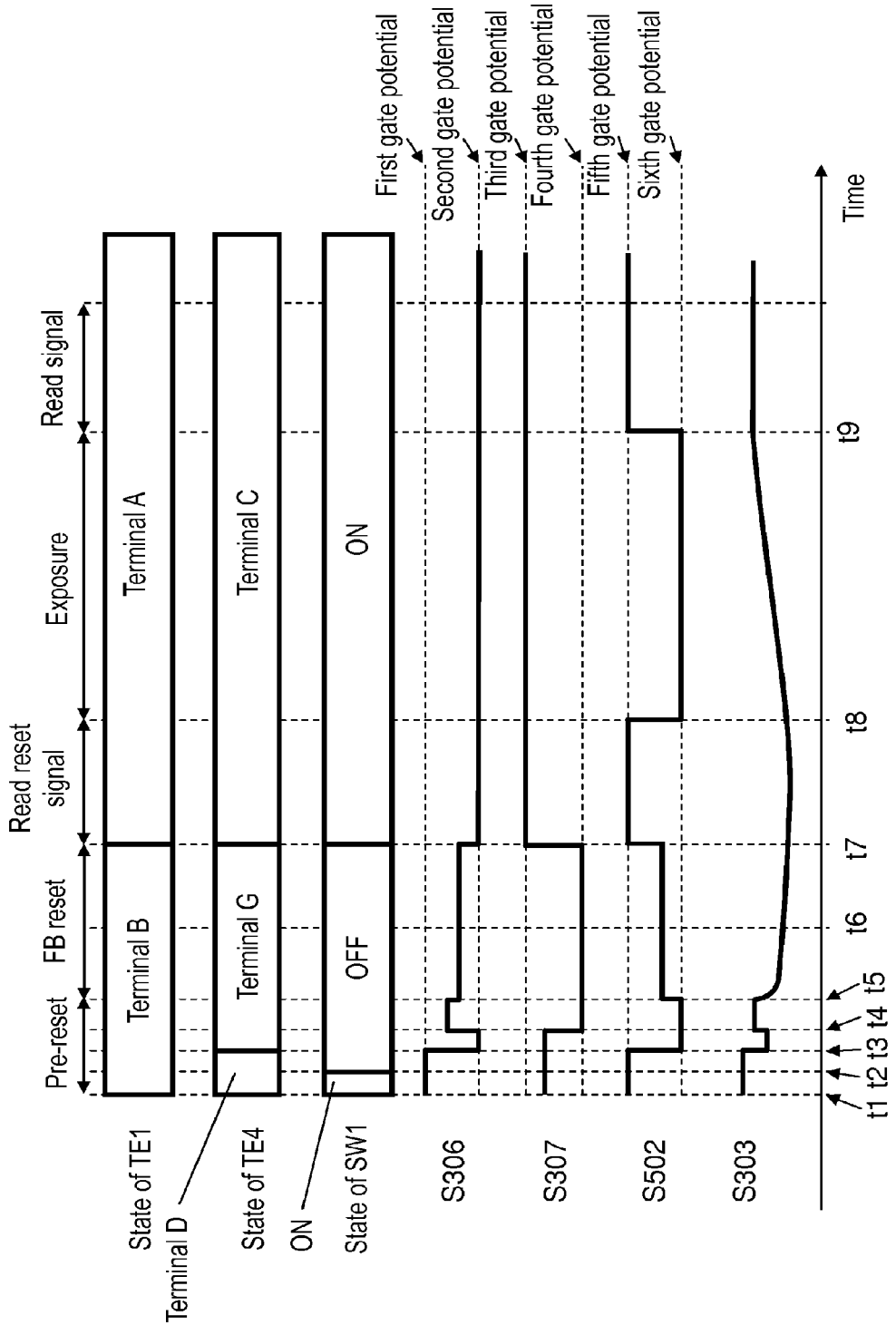
FIG. 10 is a timing chart illustrating a driving method of the solid-state imaging apparatus according to the fourth exemplary embodiment.

FIG. 10 is a timing chart illustrating a driving method for pixels on the mth row including pixel 10 illustrated in FIG. 9 and its control circuit.

The timing chart of FIG. 10 will be described in time series.

Firstly, during a first period (times t1 to t5: pre-reset period) for discharging a charge in charge storage unit, pre-reset is performed for discharging a charge in charge storage unit 115 of pixel 10 arranged in the mth row.

At time t1, SW1 is on, and source line 901 is connected to the reference potential (terminal B) via terminal TE1. Column signal line 902 is connected to second power supply voltage VDD2 (terminal D) via terminal TE4. Since control signal S502 is in a high level (fifth gate potential), selection transistor 501 is conductive. Since control signal S306 is in a high level (first gate potential), reset transistor 117 is conductive. Since control signal S307 has a potential between a high level (third gate potential) and a low level (fourth gate potential), cutoff transistor 302 acts as a resistor. In this case, voltage V1 obtained by subtracting a voltage drop due to a resistance by cutoff transistor 302 from second power supply voltage VDD2 is applied to charge storage unit 115, potential S303 of other one 303 of the source and the drain of reset transistor 117, and one of the source and the drain of selection transistor 501. Accordingly, amplifying transistor 116 whose threshold voltage is positive operates in a saturation region.

At time t2, switch SW1 becomes off. Specifically, source line 901 is electrically floating, and hence, a voltage of parasitic capacitance $C_{SS}$ of source line 901 increases to a voltage obtained by subtracting threshold voltage $V_{th,amp}$ of amplifying transistor 116 from voltage $V_1$, i.e., to voltage of $V_1-V_{th,amp}$.

As a result, amplifying transistor 116 becomes nonconductive.

At time t3, control signal S502 becomes a low level (sixth gate potential), whereby selection transistor 501 becomes nonconductive. Since control signal S306 becomes a low level (second gate potential), reset transistor 117 becomes nonconductive. Column signal line 902 is connected to the reference potential (terminal G) via terminal TE4. In this case, control signal S307 has a potential between a high level and a low level, so that cutoff transistor 302 acts as a resistor. Discharge to the reference potential from the other one 303 of the source and the drain of reset transistor 117 via cutoff transistor 302 occurs, resulting in that potential S303 of other one 303 of the source and the drain of reset transistor 117 drops.

At time t4, control signal S306 has potential $V_2$ between a high level and a low level. Therefore, reset transistor 117 operates in a saturation region. Cutoff transistor 302 becomes nonconductive because control signal S307 is in a low level. Selection transistor 501 is still nonconductive. In this case, other one 303 of the source and the drain of reset transistor 117 is electrically floating, and hence, a voltage of its parasitic capacitance $C_0$ increases to a voltage obtained by subtracting threshold voltage $V_{th,rst}$ of reset transistor 117 from voltage $V_2$, i.e., to voltage of $V_2-V_{th,rst}$. In this case, column signal line 902 can be connected to any one of the signal output unit (terminal C), second power supply voltage VDD2 (terminal D), and the reference potential (terminal G), because cutoff transistor 302 is nonconductive. In the present exemplary embodiment, column signal line 902 is connected to the reference potential.

During a second period (times t5 to t7: feedback reset period) in which a negative feedback is performed for charge storage unit 115 after the first period (pre-reset period), cutoff transistor 302 is still nonconductive. Control signal S502 has a potential between a high level and a low level, so that selection transistor 501 acts as a cascode transistor. Since control signal S306 is set to $V_{g,rst}$ between a high level and a low level, the channel resistance of reset transistor 117 increases. As a result, the bandwidth of kTC noise generated from charge storage unit 115 decreases. In addition, selection transistor 501 is operated as a cascode transistor, whereby an apparent source-drain conductance of amplifying transistor 116 can be reduced. Accordingly, the gain can be increased more than the first exemplary embodiment.

At time t6, a kTC noise suppression action for charge storage unit 115 is performed. In this case, a signal with an opposite phase is transmitted by a negative feedback of the cascode amplifying circuit in which the gate of amplifying transistor 116 is regarded as an input, selection transistor 501 is regarded as a cascode transistor, and nonconductive cutoff transistor 302 is regarded as a load, whereby kTC noise from charge storage unit 115 can be canceled. The reduction in the gain of the amplifying circuit can be prevented by lowering the bandwidth of kTC noise to the range within the operating band of the amplifying circuit. In addition, because cutoff transistor 302 serving as a load of the amplifying circuit is nonconductive, a resistance can be regarded as infinite without being affected by a channel length modulation effect coefficient. Accordingly, the gain can be increased even with a negative feedback circuit.

At this point, the potential of source line 901 is larger than potential S303, and potential S303 is larger than the potential of charge storage unit 115. Therefore, a charges is discharged to source line 901 from parasitic capacitance $C_0$ of the other one 303 of the source and the drain of reset transistor 117 via selection transistor 501 and amplifying transistor 116. Accordingly, potential S303 of other one 303 of the source and the drain of reset transistor 117 lowers. Notably, parasitic capacitance $C_{ss}$ of source line 901 is sufficiently larger than parasitic capacitance $C_0$. Therefore, a voltage change to the charge discharged from parasitic capacitance $C_0$ is very small, whereby parasitic capacitance $C_{ss}$ apparently acts as a power supply.

In this case, current $I_{amp}$ flowing through amplifying transistor 116 is determined by voltage $V_{g,amp}$ of charge storage unit 115, voltage $V_{s,amp}$ of parasitic capacitance $C_{SS}$ of source line 901, and threshold voltage $V_{th,amp}$ of amplifying transistor 116. Therefore, current $I_{amp}$ can be represented by Equation 1.

$$I_{amp}=I_0\exp\{\beta(V_{g,amp}-V_{s,amp}-V_{th,amp})\} \quad \text{(Equation 1)}$$

Since $V_{s,amp}$ keeps voltage of $V_1$—$V_{th,amp}$ set at time t3, current $I_{amp}$ flowing through amplifying transistor 116 is represented by Equation 2.

$$I_{amp}=I_0\exp\{\beta(V_{g,amp}-V_1)\} \quad \text{(Equation 2)}$$

Specifically, current $I_{amp}$ does not depend on threshold voltage $V_{th,amp}$ of amplifying transistor 116. Accordingly, a constant current can be flown even if variation in threshold voltages occurs among pixels. Consequently, a kTC noise suppression action for charge storage units 115 of all pixels 10 can similarly be performed without being affected by a variation in threshold voltage of amplifying transistor 116 among pixels.

When $I_{amp}$ flows, potential S303 of other one 303 of the source and the drain of reset transistor 117 drops due to discharge. Current $I_{rst}$ flowing through reset transistor 117 is determined by control signal S306 ($V_{g,rst}$), potential S303 ($V_{s,rst}$) of other one 303 of the source and the drain of reset transistor 117, and threshold voltage $V_{th,rst}$ of reset transistor 117. Therefore, current $I_{rst}$ can be represented by Equation 3.

$$I_{rst}=I_0\exp\{\beta(V_{g,rst}-V_{s,rst}-V_{th,rst})\} \quad \text{(Equation 3)}$$

$V_{s,rst}$ is set as $V_2-V_{th,rst}$ at time t5. $V_{s,rst}$ gradually drops due to the discharge of parasitic capacitance $C_0$. When a time is defined as t, $V_{s,rst}$ is represented by Equation 4.

$$V_{s,rst}=-I_{amp}\times t/C_0+(V_2-V_{th,rst}) \quad \text{(Equation 4)}$$

Therefore, current $I_{rst}$ flowing through reset transistor 117 is represented by Equation 5.

$$I_{rst}=I_0\exp\{\beta(V_{g,rst}-I_{amp}\times t/C_0-V_2+V_{th,rst}-V_{th,rst})\} \quad \text{(Equation 5)}$$

Equation 6 can be obtained by the rearrangement of Equation 5.

$$I_{rst}=I_0\exp\{\beta(V_{g,rst}+I_{amp}\times t/C_0-V_2)\} \quad \text{(Equation 6)}$$

Specifically, current $I_{rst}$ does not depend on threshold voltage $V_{th,rst}$ of reset transistor 117. Accordingly, a constant current can be flown even if variation in threshold voltage of reset transistor 117 occurs among pixels. Consequently, a kTC noise suppression action for charge storage units 115 of all pixels 10 can similarly be performed without being affected by a variation in threshold voltage of reset transistor 117 among pixels.

Subsequently, during a third period (times t7 to t8: reset signal reading period) for reading a reset signal to column signal line 902 after the second period (feedback reset period), control signal S502 and control signal S307 both become high level, so that selection transistor 501 and cutoff transistor 302 both become conductive. Since a low-level potential is applied to the gate of reset transistor 117, reset transistor 117 becomes nonconductive. Switch SW1 is turned on, whereby source line 901 is connected to first power supply voltage VDD1 (terminal A) via terminal TE1. Since column signal line 902 is connected to the signal output unit (terminal C) via terminal TE4, the reset signal is read to column signal line 902.

Subsequently, during a fourth period (times t8 to t9: exposure period) for generating a signal charge in photoelectric conversion unit 301 after the third period (reset signal reading period), control signal S502 is in a low level, so that selection transistor 501 become nonconductive. Then, an exposure period of pixel 10 arranged in the mth row is started. In this case, photoelectric conversion unit 301 and both column signal line 902 and source line 901 are not electrically connected to each other. Therefore, source line 901 can be connected to the first power supply voltage VDD1 (terminal A) or to the reference potential (terminal B), and column signal line 902 can be connected to any one of the signal output unit (terminal C), second power supply voltage (terminal D), and the reference potential (terminal G). In the present exemplary embodiment, source line 901 is connected to first power supply voltage VDD1 (terminal A) via terminal TE1, and column signal line 902 is still connected to the signal output unit (terminal C) via terminal TE4 for preparation of the next readout.

Then, during a fifth period (after time t9: signal reading period) for reading a pixel signal corresponding to the signal charge after the fourth period (exposure period), selection transistor 501 becomes conductive, because control signal S502 becomes a high level. As a result, a pixel signal corresponding to an amount of signal charge generated from photoelectric conversion unit 301 of a plurality of pixels on the mth row is read to column signal line 902. kTC noise can be reduced by obtaining the difference between the pixel signal and the reset signal read during the period from time t7 to time t8.

Then, a difference between the reset signal read during the third period and the pixel signal read during the fifth period is obtained by noise cancel circuit 15.

The solid-state imaging apparatus according to the fourth exemplary embodiment forms a negative feedback cascode circuit when resetting charge storage unit 115, thereby being capable of increasing the gain. Accordingly, this solid-state imaging apparatus can attain a high kTC noise suppression effect. This solid-state imaging apparatus is not affected by the variation in threshold voltage $V_{th,amp}$ of amplifying transistor 116 and threshold voltage $V_{th,rst}$ of reset transistor 117 among pixels, thereby being capable of attaining similar noise suppression effect for all pixels.

Fifth Exemplary Embodiment

Next, a fifth exemplary embodiment will be described.

Figure 11:
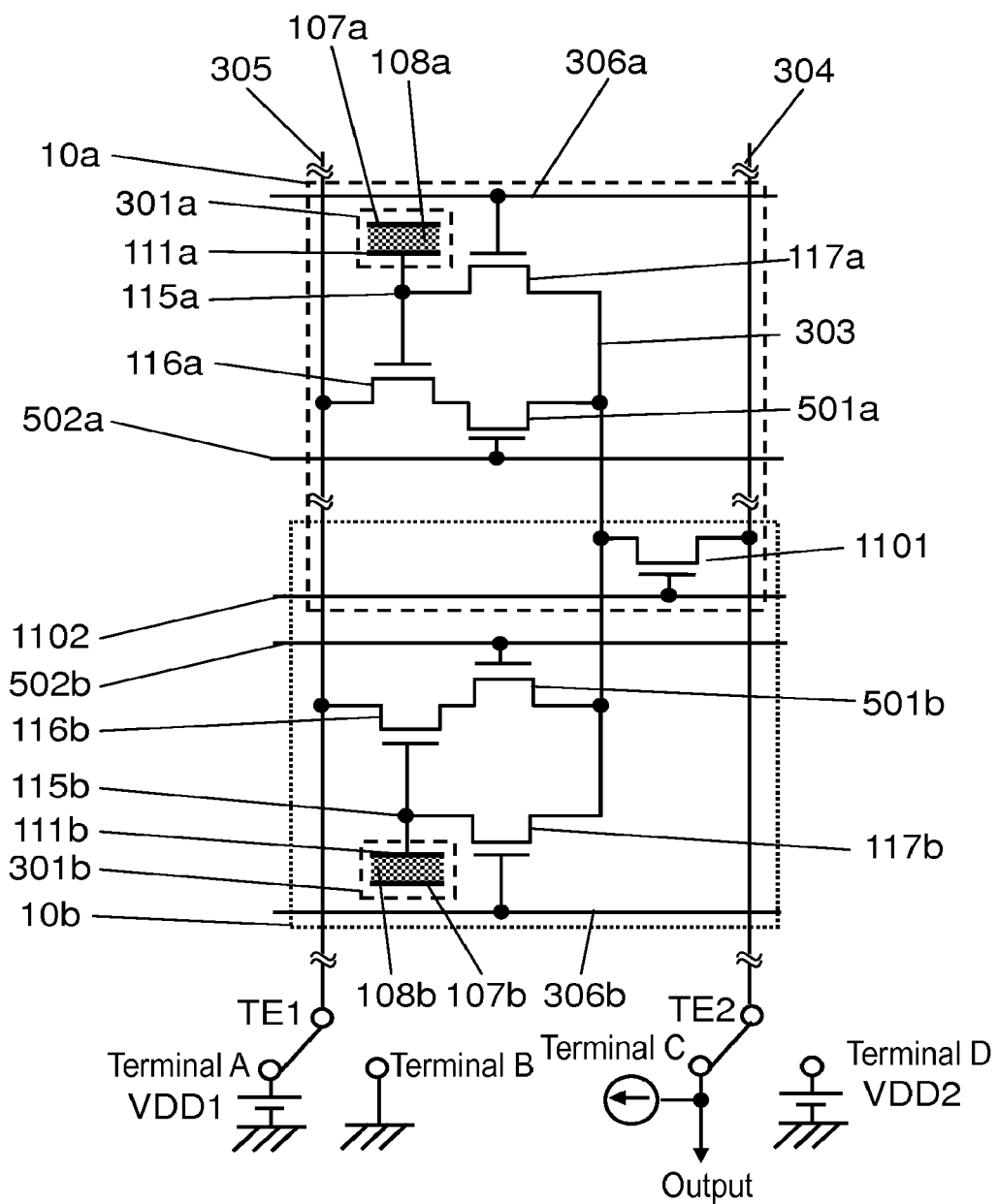
FIG. 11 is a circuit diagram of a pixel and a control circuit of the solid-state imaging apparatus according to a fifth exemplary embodiment.

FIG. 11 is a diagram illustrating one example of a circuit of pixel 10a belonging to (2m−1)th row (m is a natural number) and nth column (n is a natural number) of pixel unit 12, pixel 10b belonging to 2mth row and nth column, and its control circuit according to the fifth exemplary embodiment. Pixels 10a and 10b have the circuit structure same as pixel 10 according to the second exemplary embodiment.

The fifth exemplary embodiment is different from the second exemplary embodiment in that adjacent pixels 10a and 10b on the same column share cutoff transistor 1101. Notably, cutoff transistor 1101 may be connected in parallel to four or more pixels adjacent to one another in the same row and in the same column.

Figure 12:
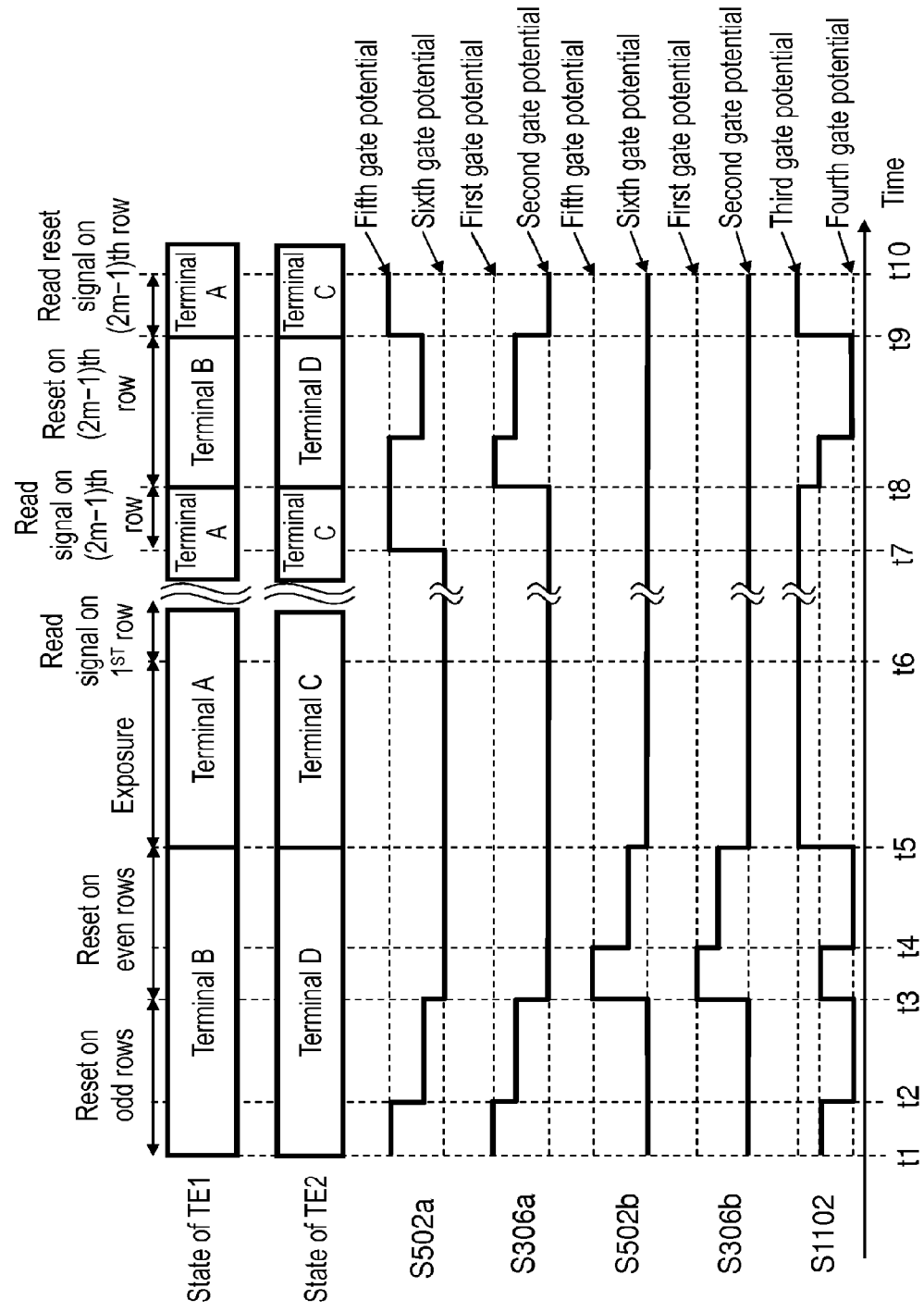
FIG. 12 is a timing chart illustrating a driving method of the solid-state imaging apparatus according to the fifth exemplary embodiment.

FIG. 12 is a timing chart illustrating a driving method for pixels on the (2m−1)th row including pixel 10a illustrated in FIG. 11, pixels on the 2mth row including pixel 10b, and its control circuit. Control signal S1102 is applied to the gate of cutoff transistor 1101 from cutoff transistor control line 1102.

The timing chart of FIG. 12 will be described in time series.

At time t1, pre-reset is started for discharging a charge in charge storage units 115a of all pixels 10a on odd rows ((2m−1)th row). Source line 305 is connected to the reference potential (terminal B) via terminal TE1. Column signal line 304 is connected to second power supply voltage VDD2 (terminal D) via terminal TE2. Since control signal S502a on odd rows is in a high level (fifth gate potential), selection transistors 501a of pixels 10a on the odd rows are conductive. Since control signal S306a is in a high level (first gate potential), reset transistor 117a is conductive. Since control signal S1102 has a potential between a high level (third gate potential) and a low level (fourth gate potential), cutoff transistor 1101 acts as a resistor. In this case, a voltage obtained by subtracting a voltage drop due to a resistance of cutoff transistor 1101 from second power supply voltage VDD2 is applied to charge storage unit 115a, potential S303 of other one 303 of the source and the drain of reset transistor 117a, and one of the source and the drain of selection transistor 501a.

On the other hand, since control signal S502b is in a low level (sixth gate potential), selection transistors 501b of pixels 10b on the even rows (2mth row) are nonconductive. Since control signal S306b is in a low level (second gate potential), reset transistor 117b is nonconductive.

At time t2, feedback reset is started at a time in all pixels 10a on the odd rows. Control signal S502a on the odd rows has a potential between a high level and a low level, so that selection transistors 501a on the odd rows act as a cascode transistor. Since control signal S306a is set to a voltage between a high level and a low level, the channel resistance of reset transistor 117a increases. As a result, the bandwidth of kTC noise generated from charge storage unit 115a decreases. Cutoff transistor 1101 is set nonconductive because control signal S1102 is in a low level. A noise suppression action for charge storage unit 115a of pixel 10a is performed in accordance with a principle similar to the second exemplary embodiment. Power consumption at reset is small, whereby global reset can be implemented.

At time t3, pre-reset is started for discharging a charge in charge storage unit 115b of all pixels 10b on even rows (2mth row). Since control signal S502b on even rows is in a high level, selection transistors 501b of pixels 10b on the even rows are conductive. Since control signal S306b is in a high level, reset transistor 117b is conductive. Control signal S1102 has a potential between a high level and a low level, so that cutoff transistor 1101 acts as a resistor. In this case, a voltage obtained by subtracting a voltage drop due to a resistance of cutoff transistor 1101 from second power supply voltage VDD2 is applied to charge storage unit 115b, potential S303 of other one 303 of the source and the drain of reset transistor 117b, and one of the source and the drain of selection transistor 501b.

On the other hand, since control signal S502a is in a low level, selection transistors 501a of pixels 10a on the odd rows ((2m−1)th row) are nonconductive. Reset transistor 117a is nonconductive because control signal S306a is in a low level.

At time t4, feedback reset is started at time in all pixels 10b on the even rows. Control signal S502b on the even rows has a potential between a high level and a low level, so that selection transistors 501b on the even rows act as a cascode transistor. Since control signal S306b is set to a voltage between a high level and a low level, the channel resistance of reset transistor 117b increases. As a result, the bandwidth of kTC noise generated from charge storage unit 115b decreases. Cutoff transistor 1101 is nonconductive because control signal S1102 is in a low level. A noise suppression action for charge storage unit 115b of all pixels 10b on the even rows is performed in accordance with a principle similar to the second exemplary embodiment. Power consumption at reset is small, whereby global reset can be implemented.

At time t5, exposure is started for all pixels after all pixels 10 are reset, i.e., after potential of charge storage units 115 of all pixels 10 is reset.

At time t6, a pixel signal corresponding to an amount of signal charge generated from photoelectric conversion unit 301 is output to column signal line 304 for each row.

At time t7, control signal S502a becomes a high level, and hence, selection transistor 501a becomes conductive. Pixel signals corresponding to an amount of signal charge generated in photoelectric conversion units 301a of a plurality of pixels 10a on the (2m−1)th row that is an odd row are read to column signal line 304.

During a period from time t8 to time t9, potential of charge storage units 115a of pixels 10a on the (2m−1)th row is reset by the drive similar to the drive during the period from time t1 to time t3.

Since column signal line 304 is connected to the signal output unit (terminal C) via terminal TE2, the reset signal from pixel 10a on the (2m−1)th row is read, during the period from time t9 to time t10. kTC noise can be reduced by obtaining the difference between the reset signal and the pixel signal read during the period from time t7 to time t8.

The solid-state imaging apparatus according to the fifth exemplary embodiment forms a negative feedback cascode circuit when resetting charge storage unit 115, thereby being capable of increasing the gain. Accordingly, this solid-state imaging apparatus can attain a high kTC noise suppression effect. In addition, cutoff transistor 1101 is shared by a plurality of pixels, which can reduce a circuit area. Accordingly, this structure is advantageous for microfabrication of a solid-state imaging apparatus.

Sixth Exemplary Embodiment

Next, a sixth exemplary embodiment will be described.

Figure 13:
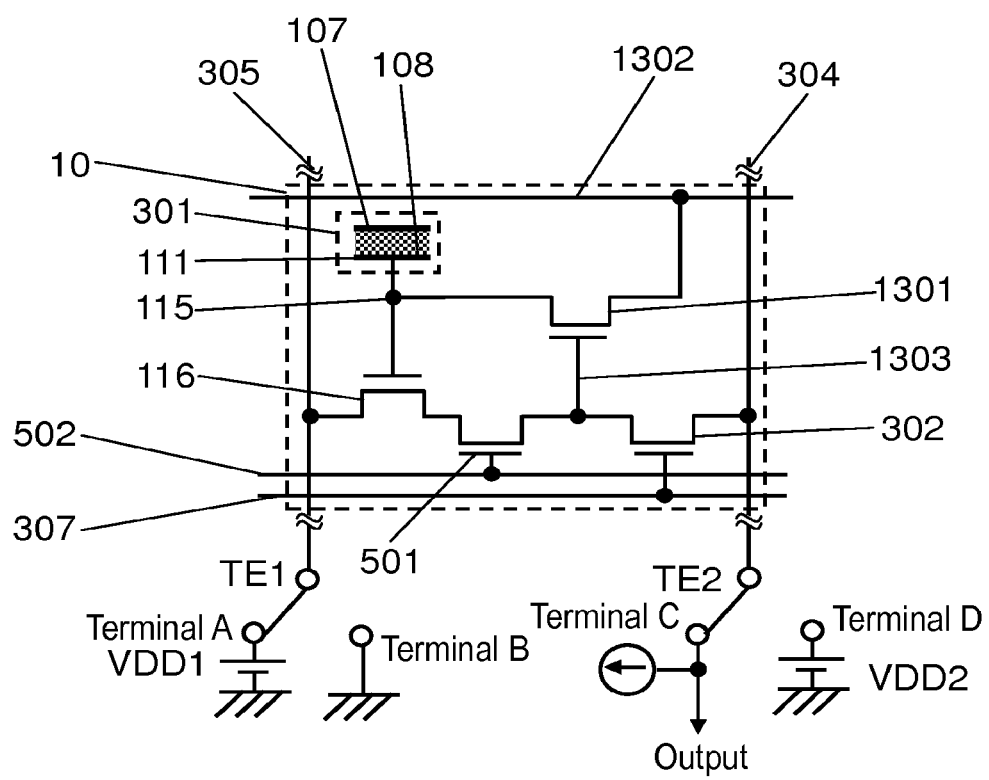
FIG. 13 is a circuit diagram of a pixel and a control circuit of a solid-state imaging apparatus according to a sixth exemplary embodiment.

FIG. 13 is a diagram illustrating one example of a circuit of pixel 10 belonging to an mth row (m is a natural number) and an nth column (n is a natural number) of pixel unit 12, and its control circuit according to the present exemplary embodiment.

Pixel unit 12 includes, for each column, source line 305 connected to one of first power supply voltage VDD1 (terminal A) or a reference potential (terminal B), and column signal line 304 connected to second power supply voltage VDD2 (terminal D) or outputting signal from a pixel.

One of a source and a drain of reset transistor 1301 is connected to charge storage unit 115. The other of the source and the drain of reset transistor 1301 is connected to reset transistor control line 1302. Gate 1303 of reset transistor 1301 is connected to one of the source and the drain of cutoff transistor 302. The other one of the source and the drain of cutoff transistor 302 is connected to column signal line 304. One of the source and the drain of the amplifying transistor 116 is connected to source line 305. The other one of the source and the drain of amplifying transistor 116 is connected to one of the source and the drain of selection transistor 501. The other one of the source and the drain of selection transistor 501 is connected to gate 1303 of reset transistor 1301.

Figure 14:
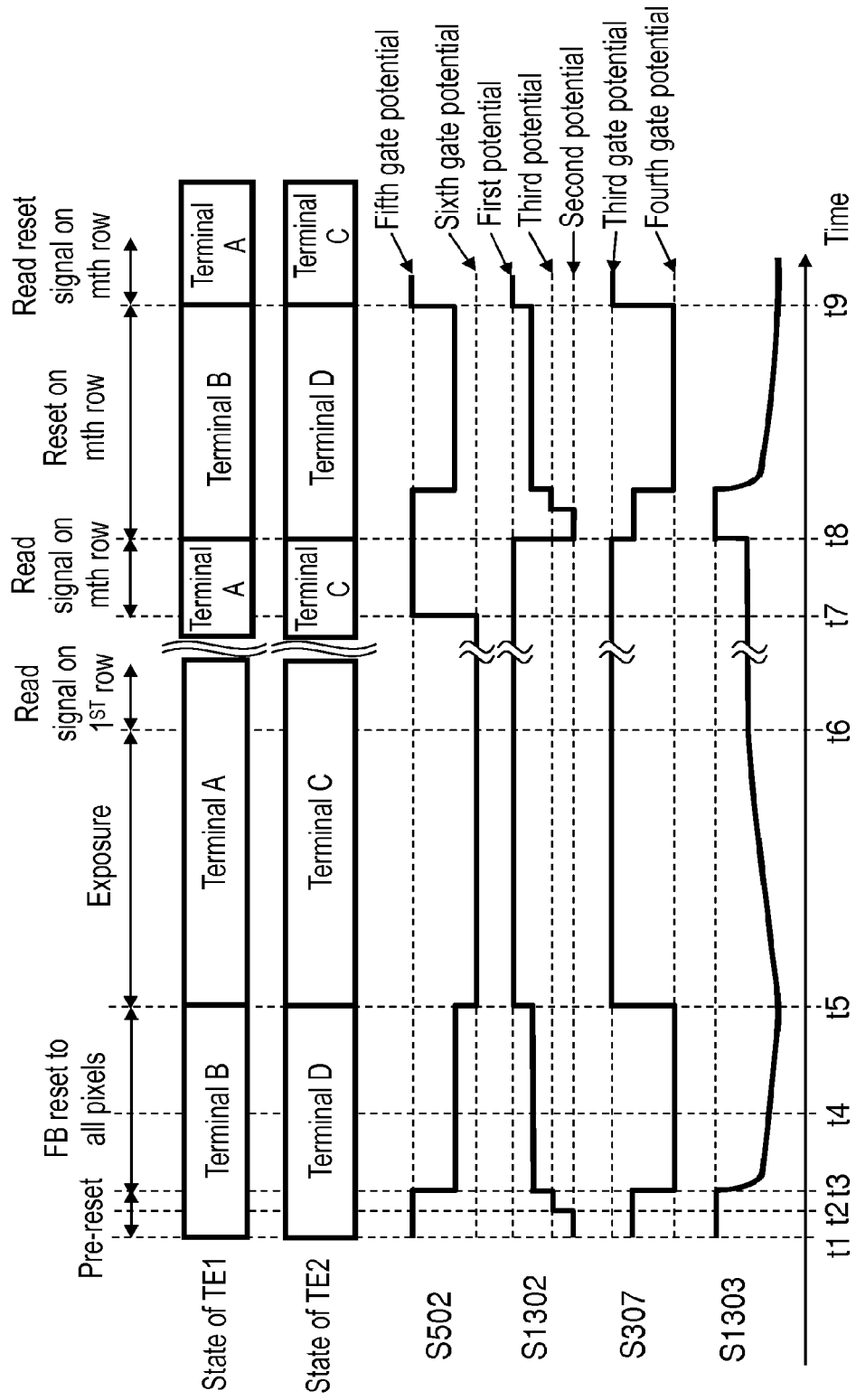
FIG. 14 is a timing chart illustrating a driving method of the solid-state imaging apparatus according to the sixth exemplary embodiment.
Figure 15:
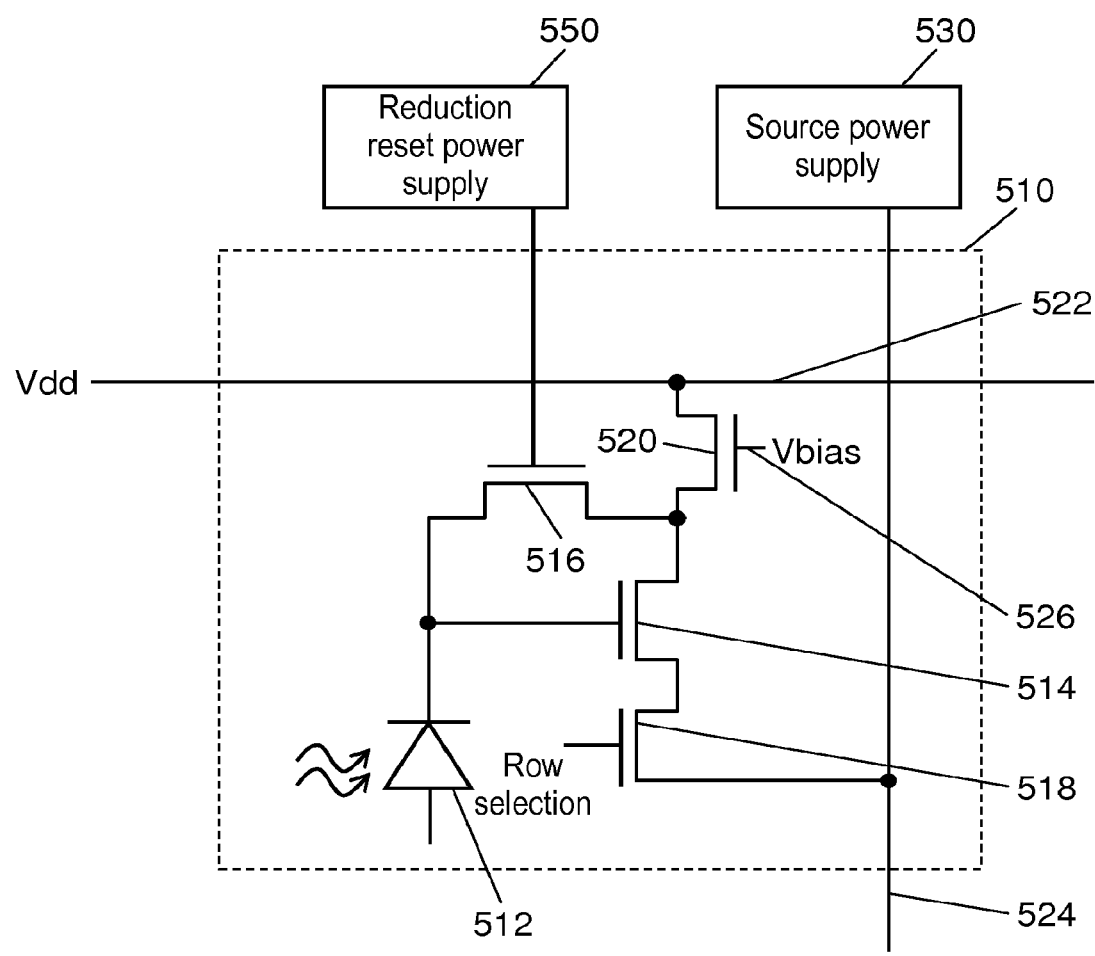
FIG. 15 is a diagram illustrating a unit pixel and its peripheral circuit described in PTL 2.

FIG. 14 is a timing chart illustrating a driving method for pixels on the mth row including pixel 10 illustrated in FIG. 13 and its control circuit. Control signal S1302 is applied to the other one of the source and the drain of reset transistor 1301 via reset transistor control line 1302.

A first period (times t1 to t3: pre-reset period) for discharging a charge in charge storage unit 115 will be described.

At time t1, source line 305 is connected to the reference potential (terminal B) via terminal TE1. Column signal line 304 is connected to second power supply voltage VDD2 (terminal D) via terminal TE2. Since control signal S502 is in a high level (fifth gate potential), selection transistor 501 is conductive. Since control signal S307 has a potential between a high level (third gate potential) and a low level (fourth gate potential), cutoff transistor 302 acts as a resistor. In this case, a voltage obtained by subtracting a voltage drop due to a resistance of cutoff transistor 302 from second power supply voltage VDD2 is applied to gate potential S1303 of reset transistor 1301, whereby reset transistor 1301 becomes conductive. A second potential that causes discharge to reset transistor control line 1302 from charge storage unit 115 via reset transistor 1301 is applied to control signal S1302. Consequently, the voltage of charge storage unit 115 becomes the second potential.

At time t2, control signal S1302 is set to have a third potential between a first potential higher than the second potential and the second potential. Since reset transistor 1301 is conductive, the potential of the charge storage unit 115 becomes the third potential of the control signal S1302. Thus, potentials of the charge storage units 115 of all pixels 10 are set to be the same value.

During a second period (times t3 to t5: feedback reset period) in which negative feedback is performed to the charge storage unit 115 after the first period (pre-reset period), feedback reset is started at a time in all pixels 10. Control signal S502 is set to have a potential between a high level and a low level (sixth gate potential), so that selection transistor 501 acts as a cascode transistor. Cutoff transistor 302 is set nonconductive because control signal S307 is set to be in a low level. Since control signal S1302 is set to have a potential between the first potential and the third potential, the channel resistance of reset transistor 1301 increases. In this case, column signal line 304 can be connected to the signal output unit (terminal C) or second power supply voltage VDD2 (terminal D), because cutoff transistor 302 is nonconductive. In the present exemplary embodiment, column signal line 304 is connected to second power supply voltage VDD2 (terminal D).

An amount of the current flowing into charge storage unit 115 from reset transistor control line 1302 via reset transistor 1301 is determined by gate potential S1303 of reset transistor 1301. An output voltage of a cascode amplifying circuit in which the gate of amplifying transistor 116 is regarded as an input, selection transistor 501 is regarded as a cascode transistor, and nonconductive cutoff transistor 302 is regarded as a load becomes gate potential S1303 of reset transistor 1301. Accordingly, a negative feedback to charge storage unit 115 occurs in this circuit. From this, the reduction in the gain of the amplifying circuit can be prevented by lowering the bandwidth of kTC noise to the range within the operating band of the amplifying circuit. In addition, because cutoff transistor 302 is nonconductive, a resistance can be regarded as infinite without being affected by a channel length modulation effect coefficient. Accordingly, the gain can be increased even with a negative feedback circuit. In addition, selection transistor 501 is operated as a cascode transistor, whereby an apparent source-drain conductance of amplifying transistor 116 can be reduced. Accordingly, the gain can be increased more than the first exemplary embodiment. Consequently, kTC noise from charge storage unit 115 can further be reduced.

Further, global reset can be implemented in accordance with a principle similar to the first exemplary embodiment. This can consequently prevent an occurrence of image distortion in reproducing a still image of a subject that is moving with high speed.

During a third period (times t5 to t6: exposure period) for generating a signal charge from photoelectric conversion unit 301 after the second period (feedback reset period), the pixel signal corresponding to the signal charge generated by the photoelectric conversion unit 301 is output to column signal line 304. Selection transistor 501 becomes nonconductive because control signal S502 is in a low level. Cutoff transistor 302 becomes conductive because control signal S307 is in a high level. Source line 305 is connected to first power supply voltage VDD1 (terminal A) via terminal TE1. Column signal line 304 is connected to the signal output unit (terminal C) via terminal TE2.

Then, during a fourth period (times t7 to t8: pixel signal reading period) for reading a pixel signal corresponding to the signal charge of pixel 10 arranged in the mth row to column signal line 304 after the third period (exposure period), cutoff transistor 302 and selection transistor 501 of pixel 10 on the mth row become conductive, because control signal S307 and control signal S502 are in a high level. As a result, pixel signals corresponding to an amount of signal charge generated from photoelectric conversion units 301 of a plurality of pixels on the mth row are read to column signal line 304.

During a fifth period (times t8 to t9: mth-row pixel reset) for resetting the potential of charge storage unit 115 of pixel 10 arranged in the mth row after the fourth period (pixel signal reading period), the potential of charge storage unit 115 of pixel 10 on the mth row is reset by the drive similar to the drive during times t1 to t5.

During a sixth period (time t9~: mth-row pixel reset signal readout) for reading a reset signal of pixel 10 arranged in the mth row to column signal line 304 after the fifth period (mth-row pixel reset), a high-level potential is applied to the other one of the source and the drain of reset transistor 1301 of pixel 10 arranged in the mth row. Due to control signal S307 in a high level, cutoff transistor 302 of pixel 10 on the mth row becomes conductive. Due to control signal S502 in a high level, selection transistor 501 of pixel 10 arranged in the mth row becomes conductive. Since column signal line 304 is connected to the signal output unit (terminal C) via terminal TE2, the reset signal from pixel 10 on the mth row is read to column signal line 304. Source line 305 is connected to first power supply voltage VDD1 (terminal A) via terminal TE1 kTC noise can be reduced by obtaining the difference between the reset signal and the pixel signal read during the period from time t7 to time t8.

Then, a difference between the pixel signal read during the fourth period and the reset signal read during the sixth period is obtained by noise cancel circuit 15.

The solid-state imaging apparatus according to the sixth exemplary embodiment forms a negative feedback cascode circuit when resetting charge storage unit 115, thereby being capable of increasing the gain. Consequently, the solid-state imaging apparatus can attain a kTC noise suppression effect higher than the circuit described in PTL 2.

INDUSTRIAL APPLICABILITY

A solid-state imaging apparatus according to the present invention can be used for a digital still camera, a camera for medical use, a monitoring camera, a digital single-lens reflex camera, a digital mirrorless camera, and the like.

REFERENCE MARKS IN DRAWINGS 1 solid-state imaging apparatus
10 pixel
12 pixel unit
13a, 13b row signal drive circuit
14 column amplifying circuit
15 noise cancel circuit
16 horizontal drive circuit
17 output stage amplifier
101 microlens
102 blue color filter
103 green color filter
104 red color filter
105 protection film
106 flattening film
107 upper electrode
108 photoelectric conversion film
109 charge blocking layer
110 inter-electrode insulating film
111 lower electrode
112 inter-wiring insulating film
113 power feed layer
114 wiring layer
115 charge storage unit
116 amplifying transistor
117 reset transistor
118 semiconductor substrate
119 well
120 STI region
121 interlayer insulating layer
301 photoelectric conversion unit
302 cutoff transistor
303 other one of source and drain of reset transistor
304 column signal line
305 source line
306 reset transistor control line
307 cutoff transistor control line
501 selection transistor
502 selection transistor control line
701 source line
702 column signal line
901 source line
902 column signal line
1101 cutoff transistor
1102 cutoff transistor control line
1301 reset transistor
1302 reset transistor control line
1303 reset transistor gate
SW1 switch
TE1~TE4 terminal
S306 reset transistor control signal
S307 cutoff transistor control signal
S502 selection transistor control signal
S1102 cutoff transistor control signal
S1302 reset transistor control signal

The invention claimed is:

1. An imaging device comprising,
a pixel including:
    a photoelectric converter that generates signal charge corresponding to incident light;
    a charge storage section that is electrically connected to the photoelectric converter and accumulates signal charge;
    a reset transistor in which one of a source and a drain is electrically connected to the charge storage section; and
    an amplifying transistor having a gate which is electrically connected to the charge storage section, wherein:
    in a first period when a voltage of the charge storage section is read out,
        one of a source and a drain of the amplifier transistor is electrically connected to a first power supply voltage,
        the other of the source and the drain of the amplifier transistor is electrically connected to a signal output section that outputs a signal transferred from the pixel, and
        a first voltage that causes the reset transistor to be nonconductive state is applied to a gate of the reset transistor, and
    in a second period when a voltage of the charge storage section is reset,
        the one of the source and the drain of the amplifier transistor is electrically connected to a reference voltage,
        the other of the source and the drain of the amplifier transistor is electrically connected to a second power supply voltage via a load, and
        a second voltage between the first voltage and a third voltage is applied to the gate of the reset transistor, the third voltage being a voltage that causes the reset transistor to be conductive state.

2. The imaging device according to claim 1, further comprising:
a first switch that electrically connects the other of the source and the drain of the amplifier transistor to one of the signal output section and the second power supply voltage selectively, wherein:

the load is electrically connected between the amplifier transistor and the first switch.

3. The imaging device according to claim 1, further comprising:
a second switch that electrically connects the one of the source and the drain of the amplifier transistor to one of the first power supply voltage and the reference voltage selectively.

4. The imaging device according to claim 1, wherein:
the pixel includes a cutoff transistor in which one of a source and a drain which is electrically connected to the other of the source and the drain of the amplifier transistor, and
the cutoff transistor functions as the load.

5. The imaging device according to claim 4, wherein the pixel includes a selection transistor electrically connected between the amplifier transistor and the cutoff transistor, one of a source and a drain of the selection transistor being electrically connected to the other of the source and the drain of the amplifier transistor, the other of the source and the drain of the selection transistor being electrically connected to the one of the source and the drain of the cutoff transistor.

6. The imaging device according to claim 4, wherein the other of the source and the drain of the reset transistor is electrically connected to the one of the source and the drain of the cutoff transistor and the other of the source and the drain of the amplifier transistor.

7. The imaging device according to claim 5, wherein the other of the source and the drain of the reset transistor is electrically connected to the one of the source and the drain of the cutoff transistor and the other of the source and the drain of the selection transistor.

8. The imaging device according to claim 1, wherein a voltage value of the reference voltage is zero.

9. The imaging device according to claim 1, further comprising a controller, wherein
in the first period, the controller causes the one of the source and the drain of the amplifier transistor to be electrically connected to the first power supply voltage, causes the other of the source and the drain of the amplifier transistor to be electrically connected to the signal output section, and causes the first voltage to be applied to the gate of the reset transistor for causing the reset transistor to become nonconductive state, and
in the second period, the controller causes the one of the source and the drain of the amplifier transistor to be electrically connected to the reference voltage, causes the other of the source and the drain of the amplifier transistor to be electrically connected to the second power supply voltage via the load, and causes the second voltage to be applied to the gate of the reset transistor.

* * * * *